(12) United States Patent
Kubodera et al.

(10) Patent No.: US 8,362,412 B2
(45) Date of Patent: Jan. 29, 2013

(54) SOLID-STATE IMAGE PICKUP ELEMENT AND DRIVING METHOD THEREOF

(75) Inventors: Takashi Kubodera, Kanagawa (JP); Akihiro Nakamura, Kumamoto (JP); Kaneyoshi Takeshita, Tokyo (JP)

(73) Assignee: Sony Corporation, Tokyo (JP)

( * ) Notice: Subject to any disclaimer, the term of this patent is extended or adjusted under 35 U.S.C. 154(b) by 619 days.

(21) Appl. No.: 12/646,512

(22) Filed: Dec. 23, 2009

(65) Prior Publication Data
US 2010/0176277 A1 Jul. 15, 2010

(30) Foreign Application Priority Data
Jan. 9, 2009 (JP) .................................. 2009-003164

(51) Int. Cl.
H01L 27/00 (2006.01)
H01L 27/146 (2006.01)

(52) U.S. Cl. ..................................... 250/208.1; 257/448

(58) Field of Classification Search ............... 250/208.1, 250/239; 257/440–453
See application file for complete search history.

(56) References Cited

U.S. PATENT DOCUMENTS
5,506,429 A * 4/1996 Tanaka et al. ................. 257/233

FOREIGN PATENT DOCUMENTS

| JP | 03-003269 | 1/1991 |
|----|-----------|--------|
| JP | 04-063473 | 2/1992 |
| JP | 11-274457 | 10/1999 |
| JP | 2000-091551 | 3/2000 |
| JP | 2004-273951 | 9/2004 |
| JP | 2006-278446 | 10/2006 |
| JP | 2007-194488 | 8/2007 |

OTHER PUBLICATIONS

Japanese Patent Office Action corresponding to Japanese Serial No. 2009-003164 dated Jun. 21, 2011.

* cited by examiner

Primary Examiner — Que T Le
Assistant Examiner — Don Williams
(74) Attorney, Agent, or Firm — SNR Denton US LLP

(57) ABSTRACT

A solid-state image pickup element includes: (A) a light receiving/charge accumulating region formed in a semiconductor layer and formed by laminating M (where $M \geq 2$) light receiving/charge accumulating layers; (B) a charge outputting region formed in the semiconductor layer; (C) a depletion layer forming region formed of a part of the semiconductor layer, the part of the semiconductor layer being situated between the light receiving/charge accumulating region and the charge outputting region; and (D) a control electrode region for controlling a state of formation of a depletion layer in the depletion layer forming region, wherein the solid-state image pickup element further includes a light receiving/charge accumulating layer extending section extending from each light receiving/charge accumulating layer to the depletion layer forming region.

20 Claims, 21 Drawing Sheets

CHARGE OUTPUTTING SECTION

CONTROL ELECTRODE SECTION

CHARGE OUTPUTTING SECTION

CHARGE OUTPUTTING SECTION

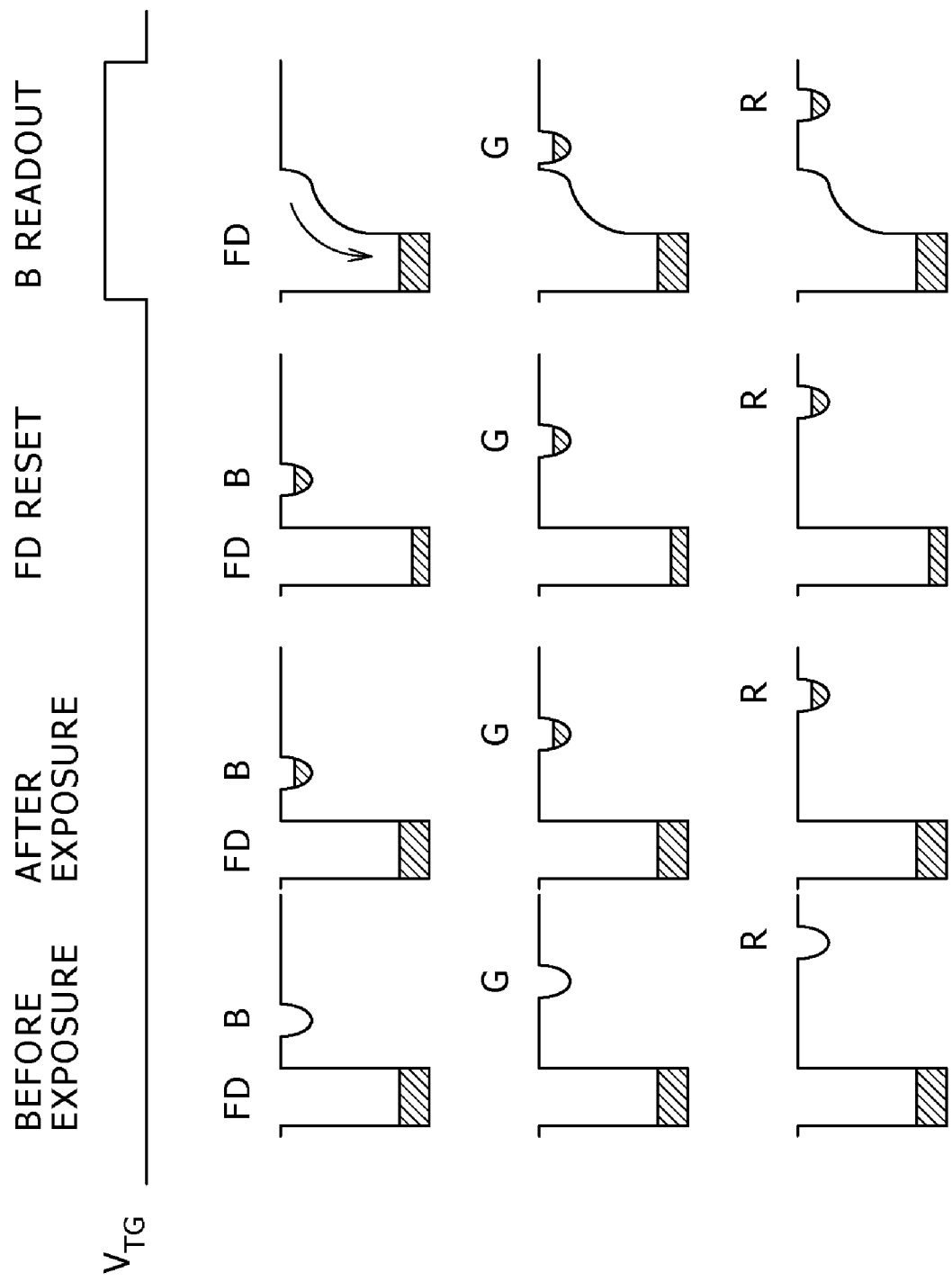

[STEP-A]

[STEP-A] CONTINUED

[STEP-B]

[STEP-B] CONTINUED

[STEP-C]

[STEP-C] CONTINUED

[STEP-D]

[STEP-D] CONTINUED

[STEP-E]

[STEP-F]

SOLID-STATE IMAGE PICKUP ELEMENT AND DRIVING METHOD THEREOF

BACKGROUND OF THE INVENTION

1. Field of the Invention

The present invention relates to a solid-state image pickup element and a driving method thereof, and particularly to a single plate type color solid-state image pickup element and a driving method thereof.

2. Description of the Related Art

In a related-art single plate type color solid-state image pickup element such as a CCD (Charge Coupled Device) image sensor, a CMOS (Complementary Metal Oxide Semiconductor) image sensor, a color filter transmitting red, green, or blue is disposed above a light receiving/charge accumulating layer. In order to obtain color video information, visible light transmitted by the color filter and received by the light receiving/charge accumulating layer is output as a signal from the solid-state image pickup element. The color filter of each color absorbs about ⅔ of incident light. There are thus disadvantages of poor efficiency of use of visible light and low sensitivity. In addition, because each solid-state image pickup element provides a color signal of only one color, there are other disadvantages of poor resolution and noticeable false color, in particular.

Accordingly, in order to overcome such disadvantages, a solid-state image pickup element in which three light receiving/charge accumulating layers are laminated has been studied and developed (see Japanese Patent Laid-Open No. 2006-278446, for example). The solid-state image pickup element of such a structure has a pixel structure in which three light receiving/charge accumulating layers for generating charges with respect to light of the three primary colors of blue, green, and red are laminated in order from a light incidence surface, for example. Each solid-state image pickup element has a signal reading circuit for reading the charges generated in the respective light receiving/charge accumulating layers independently, and performs photoelectric conversion on most of incident light. Therefore, the efficiency of use of visible light is close to 100%, and signals corresponding to the three primary colors of blue, green, and red are obtained by one solid-state image pickup element. There is thus an advantage in that an excellent image of high sensitivity and high resolution is obtained.

SUMMARY OF THE INVENTION

However, in the solid-state image pickup element disclosed in the above-described laid-open patent publication, a MOS type switch is provided for each of the laminated light receiving/charge accumulating layers. That is, three MOS type switches are provided independently of each other. Thus, the solid-state image pickup element as a whole is increased in area, and is thus not suitable for miniaturization. In addition, while a connecting region for transferring a charge from each light receiving/charge accumulating layer is provided, the connecting region is affected by kTC noise when the connecting region is formed of an $n^+$ semiconductor layer or a $p^+$ semiconductor layer.

It is accordingly desirable to provide a solid-state image pickup element having a constitution or structure in which light receiving/charge accumulating layers are laminated and which makes it possible to reduce the area of the solid-state image pickup element as a whole and to reduce effect of noise at a time of charge transfer, and a driving method thereof.

A solid-state image pickup element according to the present invention or a solid-state image pickup element in a solid-state image pickup element driving method according to a first to a third mode of the present invention includes:

(A) a light receiving/charge accumulating region formed in a semiconductor layer and formed by laminating M (where $M \geq 2$) light receiving/charge accumulating layers;

(B) a charge outputting region formed in the semiconductor layer;

(C) a depletion layer forming region formed of a part of the semiconductor layer, the part of the semiconductor layer being situated between the light receiving/charge accumulating region and the charge outputting region; and (D) a control electrode region for controlling a state of formation of a depletion layer in the depletion layer forming region, wherein the solid-state image pickup element further includes a light receiving/charge accumulating layer extending section extending from each light receiving/charge accumulating layer to the depletion layer forming region.

Incidentally, in the solid-state image pickup element according to the present invention or the solid-state image pickup element in the solid-state image pickup element driving method according to the first mode or the second mode of the present invention, projected images of the respective light receiving/charge accumulating layer extending sections in the depletion layer forming region do not need to overlap each other, or may overlap each other. In this case, while a direction of projection when the projected images are obtained by projecting the light receiving/charge accumulating layer extending sections is essentially arbitrary, suppose that the direction of the projection is a direction of a normal to the semiconductor layer (which direction may be referred to as a "Z-direction"). The same is true for the following description.

In the solid-state image pickup element driving method according to the first mode of the present invention, the control electrode region includes one control electrode section, the charge outputting region includes one charge outputting section, and via a depletion layer formed in the depletion layer forming region by sequentially applying a control voltage to the control electrode section, charges accumulated in the light receiving/charge accumulating layers are sequentially transferred to the charge outputting section.

In the solid-state image pickup element driving method according to the second mode of the present invention, thickness of a part of the depletion layer forming region, the part of the depletion layer forming region being situated between the light receiving/charge accumulating layer extending section and the control electrode region, differs according to each light receiving/charge accumulating layer, the control electrode region includes M control electrode sections, the charge outputting region includes M charge outputting sections, and via a depletion layer formed in the depletion layer forming region by applying a control voltage to the control electrode sections, charges accumulated in the light receiving/charge accumulating layers are transferred to the charge outputting sections. Incidentally, the charges accumulated in the light receiving/charge accumulating layers can be sequentially transferred to the charge outputting sections via a depletion layer formed in the depletion layer forming region by sequentially applying the control voltage to the control electrode sections, or the charges accumulated in the respective light receiving/charge accumulating layers may be simultaneously transferred to the respective charge outputting sections via a depletion layer formed in the depletion layer forming region by simultaneously applying control voltages having different values to the respective control electrode sections.

In the solid-state image pickup element driving method according to the third mode of the present invention, projected images of respective light receiving/charge accumulating layer extending sections in the depletion layer forming region do not overlap each other, thickness of a part of the depletion layer forming region, the part of the depletion layer forming region being situated between the light receiving/charge accumulating layer extending section and the control electrode region, is identical at each light receiving/charge accumulating layer, the control electrode region includes one control electrode section, the charge outputting region includes M charge outputting sections, and via a depletion layer formed in the depletion layer forming region by applying a control voltage to the control electrode section, charges accumulated in the light receiving/charge accumulating layers are simultaneously transferred to the charge outputting sections.

In the solid-state image pickup element according to the present invention and the solid-state image pickup element driving methods according to the first to third modes of the present invention, the control electrode region for controlling a state of formation of a depletion layer in the depletion layer forming region is provided. Thus, by applying an appropriate control voltage to the control electrode region, a depletion layer can be formed in the depletion layer forming region, and charges accumulated in the light receiving/charge accumulating layers can be transferred to the charge outputting region (charge outputting section) via the depletion layer. Therefore the size of the solid-state image pickup element as a whole can be reduced, and effect of noise at a time of charge transfer can be decreased. Solid-state image pickup elements having a constitution or structure that extends a depletion layer by applying an appropriate control voltage to the control electrode region and thereby controls the transfer of a charge accumulated in a light receiving/charge accumulating layer to a charge outputting region (charge outputting section) are not known as far as researches conducted by the present inventor are concerned.

BRIEF DESCRIPTION OF THE DRAWINGS

FIGS. 4A and 4B are respectively a schematic diagram showing a state of arrangement of control electrode sections and charge outputting sections in a solid-state image pickup element according to a second embodiment and a schematic partial sectional view of a state of arrangement of a first light receiving/charge accumulating layer and the like;

FIG. 9 is a diagram showing potentials in various regions, the diagram being of assistance in explaining a driving method of the solid-state image pickup element according to the first embodiment;

DETAILED DESCRIPTION OF THE PREFERRED EMBODIMENTS

Figure 1A:
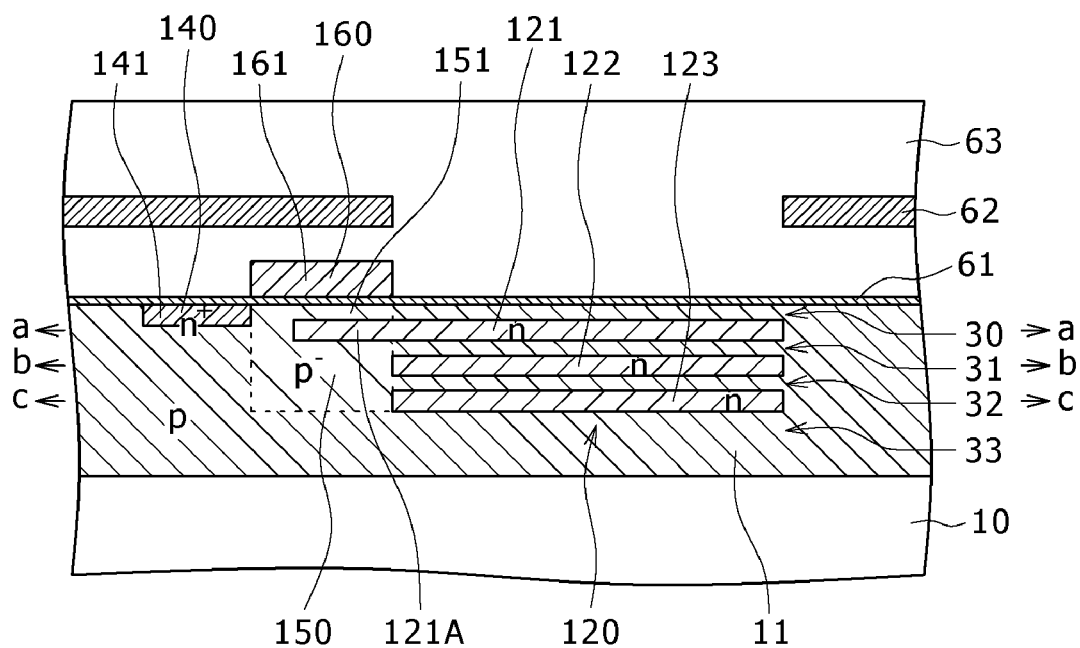
FIGS. 1A and 1B are respectively a schematic partial sectional view of a solid-state image pickup element according to a first embodiment and a schematic partial sectional view of a state of arrangement of a first light receiving/charge accumulating layer and the like, and FIG. 1A is a schematic partial sectional view taken along an arrow A-A in FIG. 1B.

The present invention will hereinafter be described on the basis of embodiments with reference to the drawings. However, the present invention is not limited to the embodiments, and various numerical values and materials in the embodiments are illustrative. Incidentally, description will be made in the following order.
1. Solid-State Image Pickup Element according to the Present Invention, Solid-State Image Pickup Element Driving Methods according to First to Third Modes of the Present Invention, and General Description
2. First Embodiment (concrete description of the solid-state image pickup element according to the present invention and the solid-state image pickup element driving method according to the first mode of the present invention)
3. Second Embodiment (concrete description of the solid-state image pickup element according to the present invention and the solid-state image pickup element driving method according to the second mode of the present invention)
4. Third Embodiment (concrete description of the solid-state image pickup element according to the present invention and the solid-state image pickup element driving method according to the third mode of the present invention and others)
[Solid-State Image Pickup Element according to the Present Invention, Solid-State Image Pickup Element Driving Methods according to First to Third Modes of the Present Invention, and General Description]

In solid-state image pickup element driving methods according to a first to a third mode of the present invention, each light receiving/charge accumulating layer can be fully depleted before charge accumulation.

In a solid-state image pickup element according to the present invention or the solid-state image pickup element driving methods according to the first to third modes of the present invention including the preferred embodiment described above, a depletion layer forming region can have a first conductivity type, a charge outputting region, a light receiving/charge accumulating layer, and a light receiving/charge accumulating layer extending section can have a second conductivity type, and the light receiving/charge accumulating layer can be interposed between an upper layer and a lower layer having the first conductivity type. In this case, when the first conductivity type is a p-type, the second conductivity type is an n-type, and a carrier is an electron. On the other hand, when the first conductivity type is an n-type, the second conductivity type is a p-type, and a carrier is a hole.

In the solid-state image pickup element according to the present invention including the preferred embodiment described above, in order to carry out the solid-state image pickup element driving method according to the first mode of the present invention, the control electrode region can include one control electrode section, the charge outputting region can include one charge outputting section, and via a depletion layer formed in the depletion layer forming region on a basis of application of a control voltage having an mth (where $1 \leq m \leq M$) value to the control electrode section (that is, M times of application of the control voltage), a charge accumulated in an mth light receiving/charge accumulating layer can be transferred to the charge outputting section. Incidentally, as the value of m is decreased, the light receiving/charge accumulating layer can be situated nearer a light incidence surface.

Alternatively, in the solid-state image pickup element according to the present invention including the preferred embodiment described above, in order to carry out the solid-state image pickup element driving method according to the second mode of the present invention, thickness of a part of the depletion layer forming region, the part of the depletion layer forming region being situated between the light receiving/charge accumulating layer extending section and the control electrode region, can differ according to each light receiving/charge accumulating layer, the control electrode region can include M control electrode sections, the charge outputting region can include M charge outputting sections, and via a depletion layer formed in the depletion layer forming region on a basis of application of a control voltage to an mth (where $1 \leq m \leq M$) control electrode section (that is, M times of sequential application of the control voltage or one time of application of varied values of application voltage to the M control electrode sections), a charge accumulated in an mth light receiving/charge accumulating layer can be transferred to an mth charge outputting section. Incidentally, as the value of m is decreased, the light receiving/charge accumulating layer can be situated nearer a light incidence surface.

Alternatively, in the solid-state image pickup element according to the present invention including the preferred embodiment described above, projected images of respective light receiving/charge accumulating layer extending sections in the depletion layer forming region can be set in a state of not overlapping each other. In this case, in order to carry out the solid-state image pickup element driving method according to the third mode of the present invention, thickness of a part of the depletion layer forming region, the part of the depletion layer forming region being situated between the light receiving/charge accumulating layer extending sections and the control electrode region, can be identical at each light receiving/charge accumulating layer, the control electrode region can include one control electrode section, the charge outputting region can include M charge outputting sections, and via a depletion layer formed in the depletion layer forming region on a basis of application of a control voltage to the control electrode section (that is, one time of application of the control voltage), a charge accumulated in an mth (where $1 \leq m \leq M$) light receiving/charge accumulating layer can be transferred to an mth charge outputting section. Incidentally, as the value of m is decreased, the light receiving/charge accumulating layer can be situated nearer a light incidence surface.

Further, in the solid-state image pickup element according to the present invention including the preferred embodiment and constitution described above, each light receiving/charge accumulating layer is desirably fully depleted before charge accumulation. This suppresses occurrence of kTC noise. Incidentally, each light receiving/charge accumulating layer does not need to be fully depleted in some cases. Also in a previous operation, a charge accumulated in each light receiving/charge accumulating layer is transferred to the charge outputting region (charge outputting section). At a time of completion of this operation, each light receiving/charge accumulating layer can be fully depleted. Thus, such an operation is also included in a concept that "each light receiving/charge accumulating layer is fully depleted before charge accumulation." As described above, also in the solid-state image pickup element driving methods according to the first to third modes of the present invention, each light receiving/charge accumulating layer can be fully depleted before charge accumulation. "Before charge accumulation" in this case is also used in a similar sense.

In addition, in the solid-state image pickup element according to the present invention including the preferred embodiment and constitution described above, or the solid-state image pickup element driving method according to the first mode or the second mode of the present invention including the preferred embodiment and constitution described above, impurity concentration of the depletion layer forming region is lowered with increasing distance from the control electrode region along a direction of a normal to the semiconductor layer (Z-direction).

Alternatively, in the solid-state image pickup element according to the present invention including the preferred embodiment and constitution described above, or the solid-state image pickup element driving method according to the first mode or the second mode of the present invention including the preferred embodiment and constitution described above, an absolute value of a control voltage applied to the control electrode region when a charge accumulated in a light receiving/charge accumulating layer is transferred to a charge outputting section (or the absolute value of the control voltage applied to a control electrode section when the charge accumulated in the light receiving/charge accumulating layer is transferred to the charge outputting section) is higher for the light receiving/charge accumulating layer situated at a longer distance from the control electrode region along a direction of a normal to the semiconductor layer (Z-direction).

Alternatively, in the solid-state image pickup element according to the present invention including the preferred embodiment and constitution described above, or the solid-state image pickup element driving method according to the first mode or the second mode of the present invention including the preferred embodiment and constitution described above, impurity concentration of a part of the depletion layer forming region, the part of the depletion layer forming region being situated between the light receiving/charge accumulating layer extending section and the control electrode region, differs depending on thickness of the part of the depletion layer forming region, the part of the depletion layer forming region being situated between the light receiving/charge accumulating layer extending section and the control electrode region. On the other hand, in the solid-state image pickup element driving method according to the third mode of the present invention including the preferred embodiment and constitution described above, impurity concentration of the depletion layer forming region can be identical (constant).

In the solid-state image pickup element according to the present invention including the various preferred embodiments and constitutions described above, or the solid-state image pickup element driving methods according to the first to third modes of the present invention including the various preferred embodiments and constitutions described above, when a charge is an electron, at a time of transferring a charge accumulated in a light receiving/charge accumulating layer to the charge outputting region (or a charge outputting section), potential of the charge outputting region (or the charge outputting section) with respect to electrons is lower than potential of a depletion layer, and the potential of the depletion layer is lower than potential of the light receiving/charge accumulating layer.

In the solid-state image pickup element according to the present invention including the various preferred embodiments and constitutions described above, or the solid-state image pickup element driving methods according to the first to third modes of the present invention including the preferred embodiments and constitutions described above (the solid-state image pickup element and the solid-state image pickup element driving methods may hereinafter be referred to simply as the "present invention"), a kind of MOS type switch composed of a transfer gate formed above the depletion layer forming region with an insulating film interposed between the transfer gate and the depletion layer forming region can be cited as concrete constitution or structure of the control electrode region. In addition, the semiconductor layer can be for example formed of a silicon layer formed on a silicon semiconductor substrate having a second conductivity type by an epitaxial growth method. In some cases, the semiconductor layer can be formed of a surface region of the silicon semiconductor substrate.

The concrete value of M, though not limited, may be two or three. When M=3, a light receiving/charge accumulating layer situated in a region nearest to the light incidence surface of the semiconductor layer (which light receiving/charge accumulating layer will be referred to as a first light receiving/charge accumulating layer (m=1) for convenience) is situated at 0.1 μm to 0.3 μm on average, for example, from the light incidence surface of the semiconductor layer; a light receiving/charge accumulating layer situated in a next nearest region (which light receiving/charge accumulating layer will be referred to as a second light receiving/charge accumulating layer (m=2) for convenience) is situated at 0.5 μm to 0.8 μm on average, for example, from the light incidence surface of the semiconductor layer; and a light receiving/charge accumulating layer situated in a most distant region (which light receiving/charge accumulating layer will be referred to as a third light receiving/charge accumulating layer (m=M=3) for convenience) is situated at 1.5 μm to 3 μm on average, for example, from the light incidence surface of the semiconductor layer. Incidentally, in such a constitution, the first light receiving/charge accumulating layer receives blue light (wavelength: for example 400 nm to 500 nm) and accumulates a charge; the second light receiving/charge accumulating layer receives green light (wavelength: for example 500 nm to 600 nm) and accumulates a charge; and the third light receiving/charge accumulating layer receives red light (wavelength: for example 600 nm to 700 nm) and accumulates a charge.

A single plate type color solid-state image pickup element such as a CCD image sensor, a CMOS image sensor or the like and a single plate type color solid-state image pickup device can be formed by the solid-state image pickup element according to the present invention. In addition, the solid-state image pickup element according to the present invention can be a front-illuminated type or a back-illuminated type.

First Embodiment

Figure 1B:
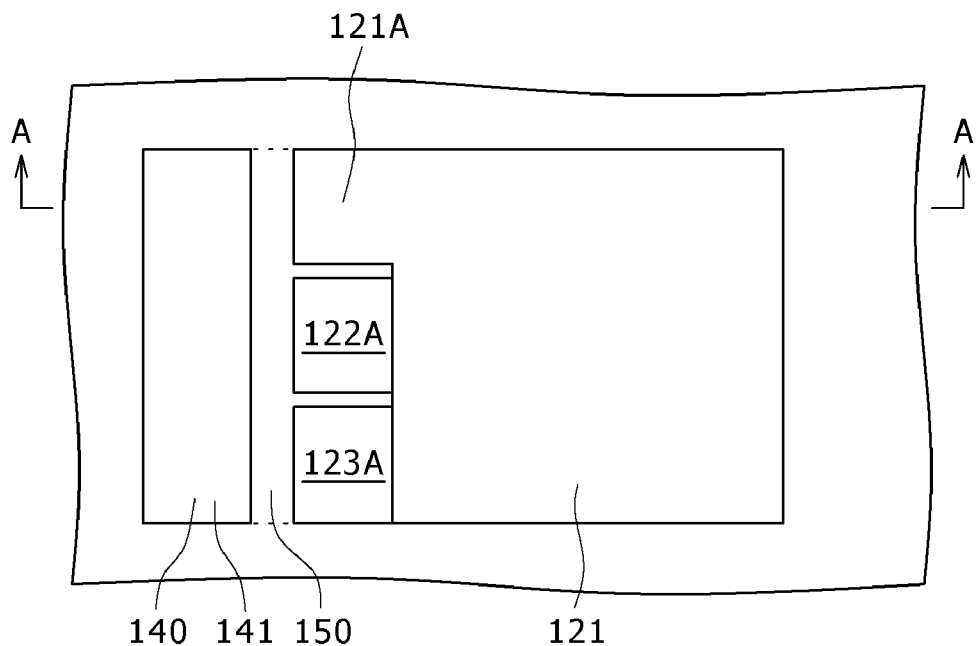
Figure 2A:
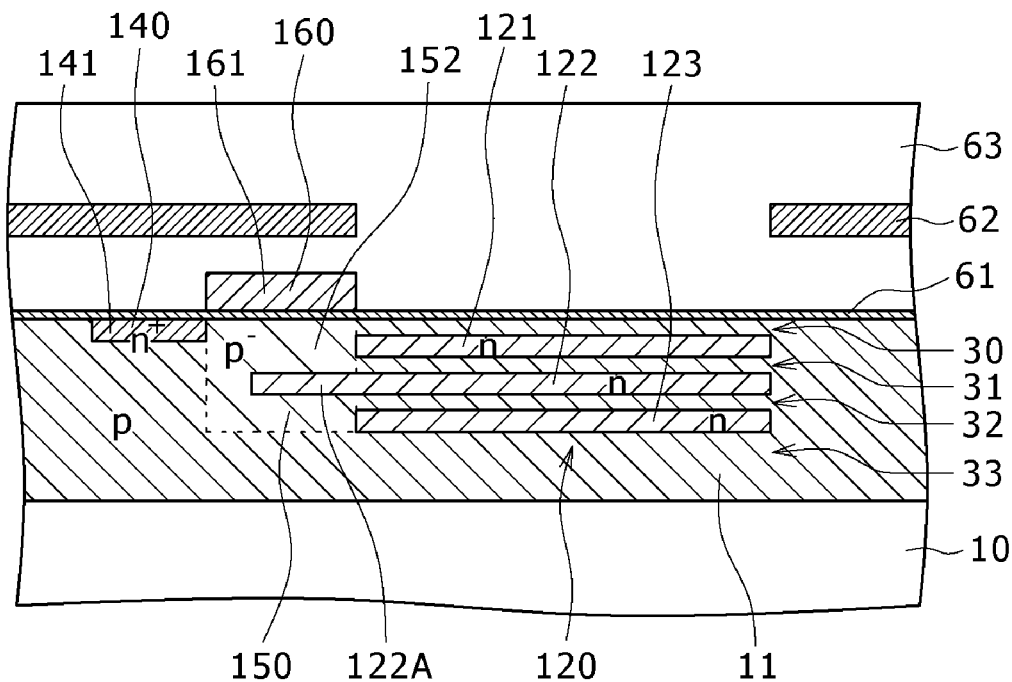
FIGS. 2A and 2B are respectively a schematic partial sectional view of the solid-state image pickup element according to the first embodiment and a schematic partial sectional view of a state of arrangement of a second light receiving/charge accumulating layer and the like, and FIG. 2A is a schematic partial sectional view taken along an arrow A-A in FIG. 2B.
Figure 2B:
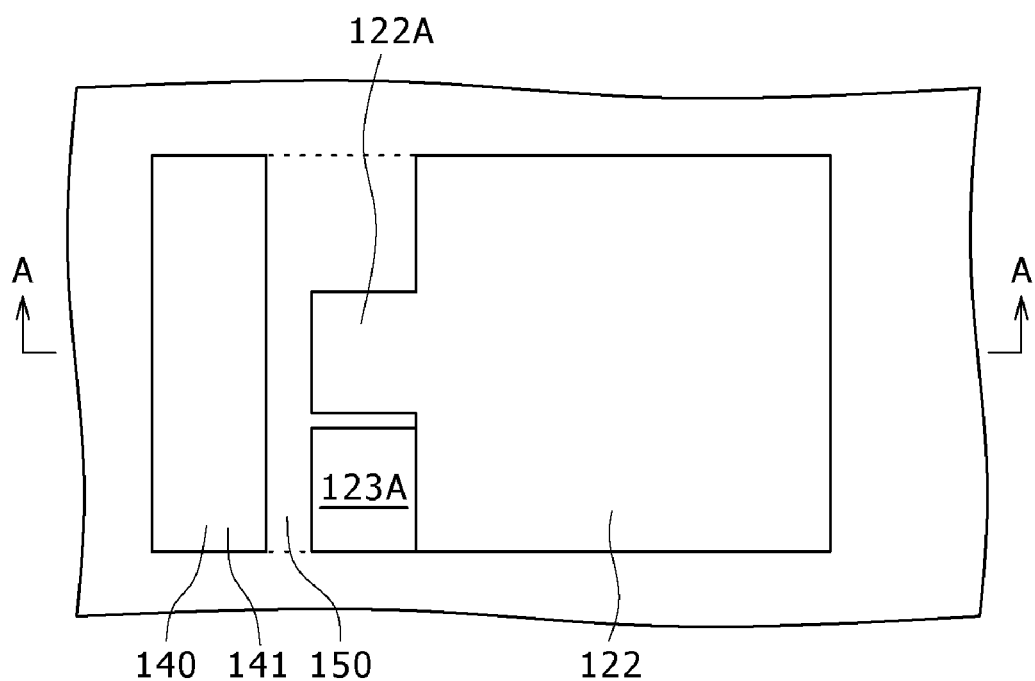
Figure 3A:
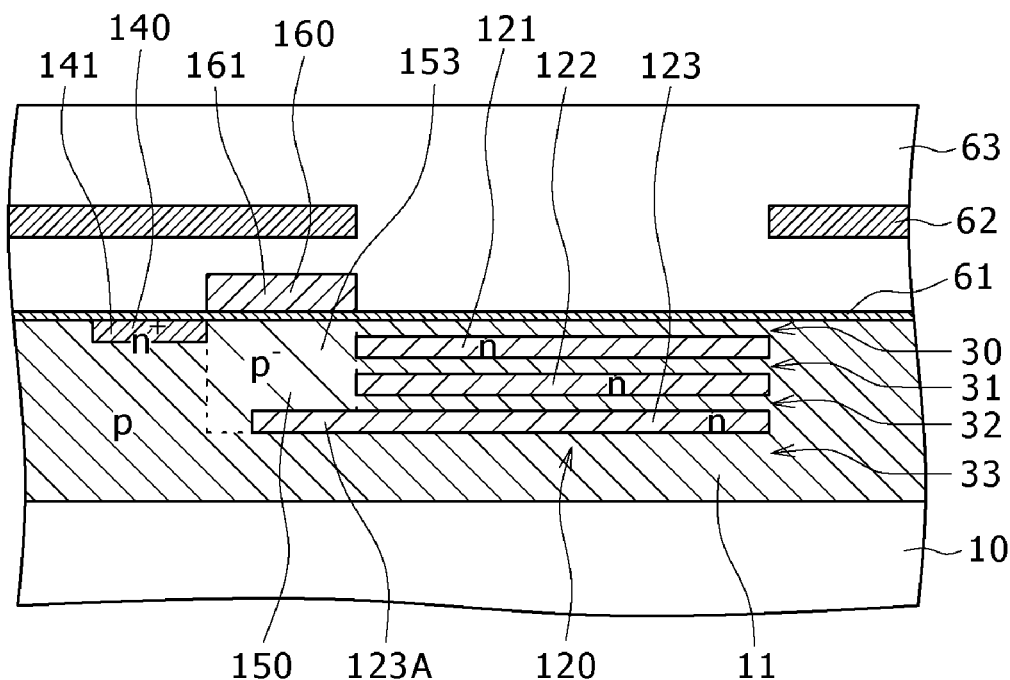
FIGS. 3A and 3B are respectively a schematic partial sectional view of the solid-state image pickup element according to the first embodiment and a schematic partial sectional view of a state of arrangement of a third light receiving/charge accumulating layer and the like, and FIG. 3A is a schematic partial sectional view taken along an arrow A-A in FIG. 3B.
Figure 3B:
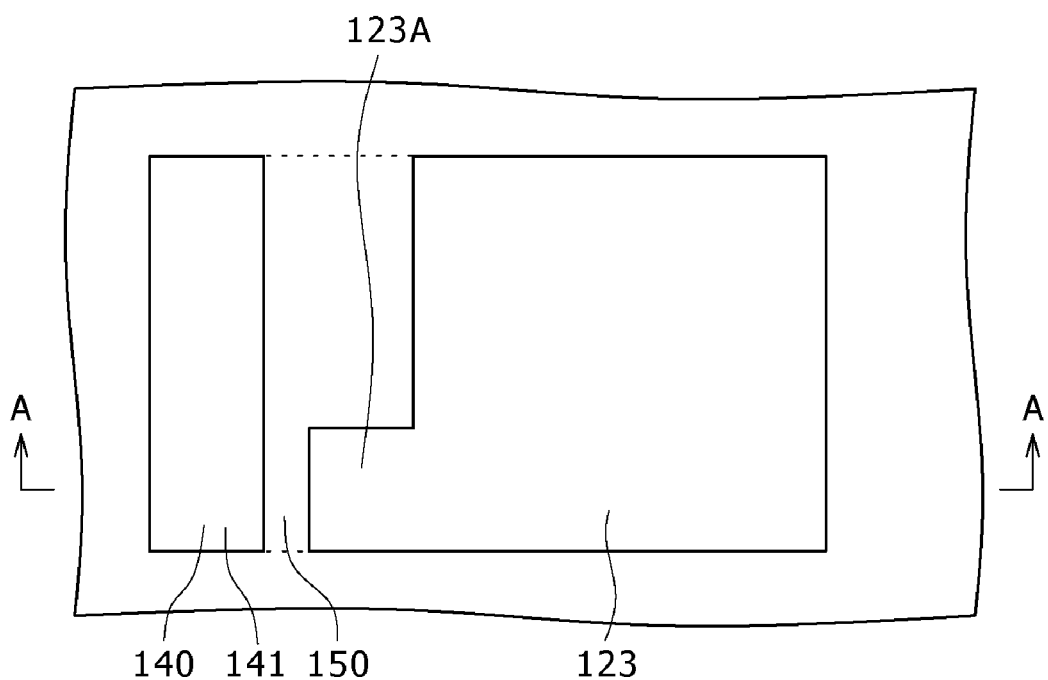

A first embodiment relates to the solid-state image pickup element according to the present invention and the solid-state image pickup element driving method according to the first mode of the present invention. FIG. 1A, FIG. 2A, and FIG. 3A are schematic partial sectional views of a solid-state image pickup element according to the first embodiment. FIG. 1B, FIG. 2B, and FIG. 3B are schematic partial sectional views of a state of arrangement of a first, a second, and a third light receiving/charge accumulating layer and the like. Incidentally, FIG. 1A, FIG. 2A, and FIG. 3A are schematic partial sectional views taken along an arrow A-A in FIG. 1B, FIG. 2B, and FIG. 3B. FIG. 1B, FIG. 2B, and FIG. 3B are schematic partial sectional views of a state of arrangement of the light receiving/charge accumulating layers and the like taken along arrows a-a, b-b, and c-c in FIG. 1A.

A solid-state image pickup element according to the first embodiment or a second or a third embodiment to be described later or a solid-state image pickup element in a solid-state image pickup element driving method according to the first embodiment or the second or third embodiment to be described later forms a CMOS image sensor, and forms a front-illuminated single plate type color solid-state image pickup element and a single plate type color solid-state image pickup device. This solid-state image pickup element includes:

(A) a light receiving/charge accumulating region 120, 220, or 320 formed in a semiconductor layer 11 and formed by laminating M (where M≧2, and specifically M=3 in the embodiments) light receiving/charge accumulating layers 121, 122, and 123, 221, 222, and 223, or 321, 322, and 323;

(B) a charge outputting region (charge retaining region) 140, 240, or 340 formed in the semiconductor layer 11;

(C) a depletion layer forming region 150, 250, or 350 formed of a part of the semiconductor layer 11, the part of the semiconductor layer 11 being situated between the light receiving/charge accumulating region 120, 220, or 320 and the charge outputting region 140, 240, or 340; and (D) a control electrode region 160, 260, or 360 for controlling a state of formation of a depletion layer in the depletion layer forming region 150, 250, or 350, wherein the solid-state image pickup element further includes light receiving/charge accumulating layer extending sections 121A, 122A, and 123A, 221A, 222A, and 223A, or 321A, 322A, and 323A extending from the respective light receiving/charge accumulating layers 121, 122, and 123, 221, 222, and 223, or 321, 322, and 323 to the depletion layer forming region 150, 250, or 350. Incidentally, the charge outputting region 140, 240, or 340 is referred to also as a floating diffusion region when a CMOS image sensor is formed by the solid-state image pickup element. On the other hand, when a CCD image sensor is formed by the solid-state image pickup element, the charge outputting region 140, 240, or 340 has a well known vertical CCD structure.

In the first embodiment, projected images of the respective light receiving/charge accumulating layer extending sections 121A, 122A, and 123A in the depletion layer forming region 150 do not overlap each other, and are juxtaposed. In addition, the control electrode region 160 includes one control electrode section 161, and the charge outputting region 140 includes one charge outputting section (charge retaining section) 141. In the solid-state image pickup element according to the first embodiment, via a depletion layer formed in the depletion layer forming region 150 on a basis of application of a control voltage having an mth (where 1≦m≦M) value to the control electrode section 161 (that is, M times of application of the control voltage), a charge accumulated in an mth light receiving/charge accumulating layer 121, 122, or 123 is transferred to the charge outputting section 141. Incidentally, in the first embodiment or the second and third embodiments to be described later, as the value of m is decreased, the light receiving/charge accumulating layer is situated nearer a light incidence surface. Specifically, as the value of m is decreased, the light receiving/charge accumulating layer is situated in a shallower region of the semiconductor layer 11 (region nearer to the light incidence surface of the semiconductor layer).

In the first embodiment or the second and third embodiments to be described later, the depletion layer forming region 150, 250, or 350 has a first conductivity type (specifically a p⁻ type). The charge outputting region, the light receiving/charge accumulating layers, and the light receiving/charge accumulating layer extending sections have a second conductivity type (specifically an n-type). Incidentally, more specifically, the charge outputting region 140, 240, or 340 is an n⁺ type impurity region, and the light receiving/charge accumulating region 120, 220, or 320 and the light receiving/charge accumulating layer extending sections 121A, 122A, and 123A, 221A, 222A, and 223A, or 321A, 322A, and 323A are an n-type impurity region. Further, the light receiving/charge accumulating layers are interposed between an upper layer and a lower layer having the first conductivity type. Specifically, the first light receiving/charge accumulating layer 121, 221, or 321 is interposed between an upper layer 30 and a lower layer 31 having the first conductivity type (specifically a p-type). The second light receiving/charge accumulating layer 122, 222, or 322 is interposed between an upper layer 31 and a lower layer 32 having the first conductivity type (specifically the p-type). The depletion layer forming region 150, 250, or 350 is surrounded by layers (p-type impurity regions) 30, 31, 32, and 33 having the first conductivity type. Further, the third light receiving/charge accumulating layer 123, 223, or 323 is interposed between an upper layer 32 and a lower layer 33 having the first conductivity type (specifically the p-type). In this case, as described above, concentration of an impurity of the second conductivity type (specifically the n-type) in the charge outputting region 140, 240, or 340 is higher than concentration of an impurity of the second conductivity type (specifically the n-type) in the light receiving/charge accumulating layers 121, 122, and 123, 221, 222, and 223, or 321, 322, and 323 and the light receiving/charge accumulating layer extending sections 121A, 122A, and 123A, 221A, 222A, and 223A, or 321A, 322A, and 323A.

In the first embodiment or the second and third embodiments to be described later, a charge is an electron, and at a time of transferring a charge accumulated in the light receiving/charge accumulating layers 121, 122, and 123, 221, 222, and 223, or 321, 322, and 323 to the charge outputting region 140, 240, or 340 (or a charge outputting section), potential of the charge outputting region 140, 240, or 340 (or the charge outputting section) with respect to electrons is lower than potential of a depletion layer, and the potential of the depletion layer is lower than potential of the light receiving/charge accumulating layers 121, 122, and 123, 221, 222, and 223, or 321, 322, and 323. In addition, before charge accumulation, each of the light receiving/charge accumulating layers 121, 122, and 123, 221, 222, and 223, or 321, 322, and 323 is fully depleted.

In this case, as described above, the first light receiving/charge accumulating layer 121, 221, or 321 is covered by the upper layer 30 having the first conductivity type (specifically the p-type). That is, the first light receiving/charge accumulating layer 121, 221, or 321 is not in an exposed state. It is therefore possible to reduce dark current and reduce kTC noise.

In the first embodiment or the second and third embodiments to be described later, the control electrode region 160, 260, or 360 is formed by a kind of MOS type switch composed of a transfer gate formed above the depletion layer forming region 150, 250, or 350 with an insulating film 61 interposed between the transfer gate and the depletion layer forming region. The semiconductor layer 11 is formed of a silicon layer formed on a silicon semiconductor substrate 10 having the second conductivity type (specifically the n-type) by an epitaxial growth method.

The control electrode region 160, 260, or 360, the light receiving/charge accumulating region 120, 220, or 320, and the charge outputting region 140, 240, or 340 are covered by a smoothing layer 63, which is transparent to incident visible light. In this case, the smoothing layer 63 on which visible light is incident is made of $SiO_2$ or SiN, for example. An on-chip microlens (not shown) is disposed on the smoothing layer 63. In addition, a light shielding layer 62 is formed above regions other than the light receiving/charge accumulating region 120, 220, or 320. Various wiring (not shown) is formed in the smoothing layer 63. Visible light incident on the smoothing layer 63 passes through an opening disposed in the light shielding layer 62, and then enters the light receiving/charge accumulating region 120, 220, or 320.

In the solid-state image pickup element according to the first embodiment, impurity concentrations of parts 151, 152, and 153 of the depletion layer forming region 150 which parts are situated between the light receiving/charge accumulating layer extending sections 121A, 122A, and 123A and the control electrode region differ depending on thickness of the parts 151, 152, and 153 of the depletion layer forming region 150 which parts are situated between the light receiving/charge accumulating layer extending sections 121A, 122A, and 123A and the control electrode region. Specifically, the impurity concentration of the depletion layer forming region 150 is lower with increasing distance from the control electrode region 160 along a direction of a normal to the semiconductor layer 11 (Z-direction) (that is, in a deeper region of the semiconductor layer 11 in the first embodiment). More specifically, the impurity concentration of the part 151 of the depletion layer forming region 150 which part is situated at the same level as the light receiving/charge accumulating layer extending section 121A of the first light receiving/charge accumulating layer 121 (at a position 0.2 µm from the light incidence surface of the semiconductor layer 11) is about $5 \times 10^{16}/cm^3$ (a concentration at which the depletion layer reaches 0.2 µm when $V_{TG}=1$ volt). The impurity concentration of the part 152 of the depletion layer forming region 150 which part is situated at the same level as the light receiving/charge accumulating layer extending section 122A of the second light receiving/charge accumulating layer 122 (at a position 0.6 µm from the light incidence surface of the semiconductor layer 11) is about $1 \times 10^{16}/cm^3$ (a concentration at which the depletion layer reaches 0.6 µm when $V_{TG}=2$ volts). The impurity concentration of the part 153 of the depletion layer forming region 150 which part is situated at the same level as the light receiving/charge accumulating layer extending section 123A of the third light receiving/charge accumulating layer 123 (at a position 2 µm from the light incidence surface of the semiconductor layer 11) is about $8 \times 10^{14}/cm^3$ (a concentration at which the depletion layer reaches 3 µm when $V_{TG}=5$ volts). Incidentally, the light incidence surface of the semiconductor layer 11 more specifically refers to the surface of the upper layer 30 having the first conductivity type (p-type).

Figure 21:
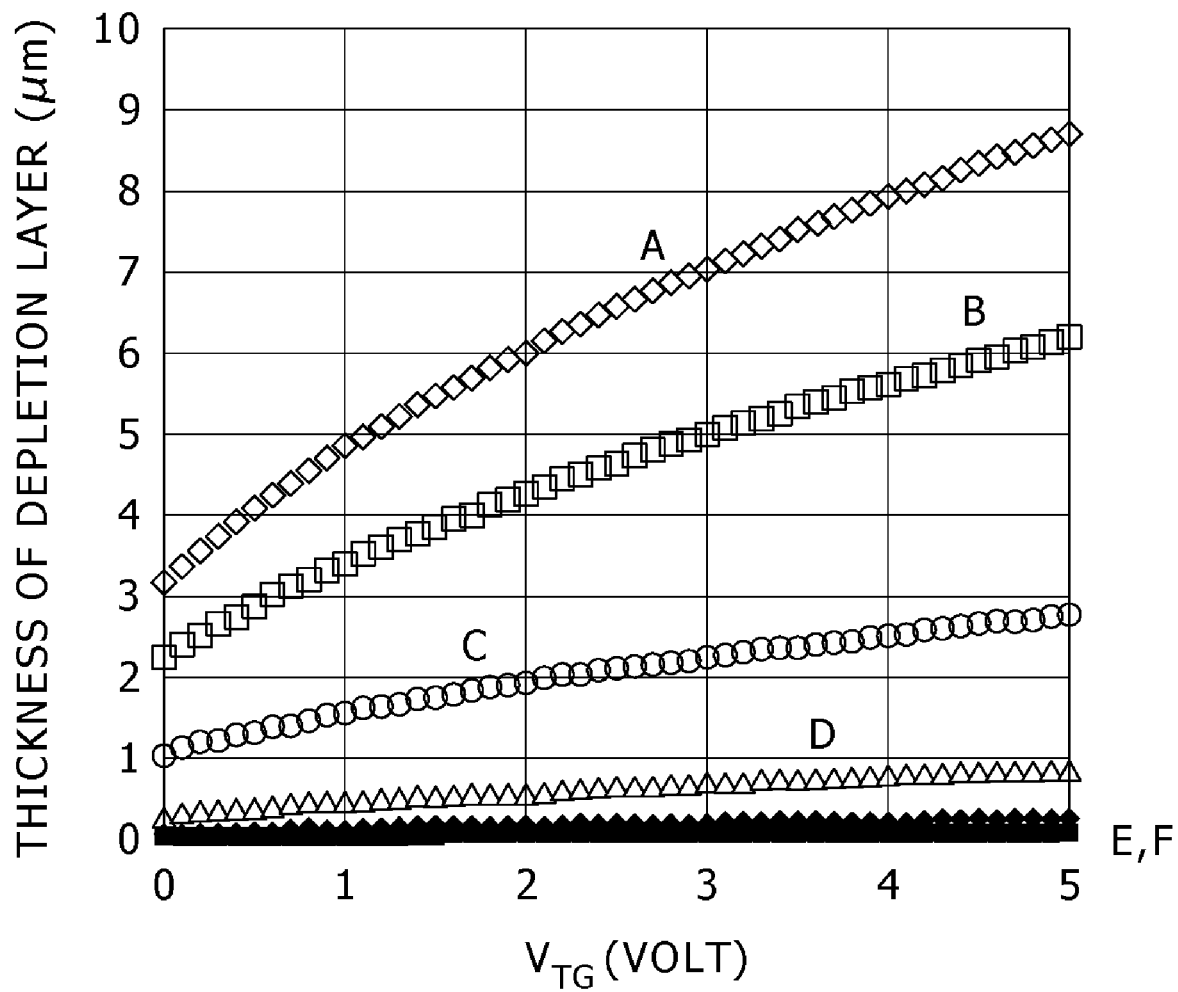
FIG. 21 is a graph showing relation between voltage $V_{TG}$ applied to a control electrode region and thickness of a depletion layer formed.

By setting the impurity concentration of the depletion layer forming region 150 as described above, and applying voltages $V_{TG-B}=1$ volt, $V_{TG-G}=2$ volts, and $V_{TG-R}=5$ volts to the control electrode region 160 (control electrode section 161), via a depletion layer formed in the depletion layer forming region 150, charges accumulated in the first, second, and third light receiving/charge accumulating layers 121, 122, and 123 are transferred to the charge outputting section 141 through the light receiving/charge accumulating layer extending sections 121A, 122A, and 123A. FIG. 21 shows relation between the voltage $V_{TG}$ applied to the control electrode region 160 and thickness of the formed depletion layer. Incidentally, in FIG. 21, a curve of white rhombic marks indicated by "A," a curve of white square marks indicated by "B," a curve of white circular marks indicated by "C," a curve of white triangular marks indicated by "D," a curve of black rhombic marks indicated by "E," and a curve of black square marks indicated by "F" represent relations when the impurity concentration is $1 \times 10^{14}/cm^3$, $2 \times 10^{14}/cm^3$, $1 \times 10^{15}/cm^3$, $1 \times 10^{16}/cm^3$, $1 \times 10^{17}/cm^3$, and $1 \times 10^{18}/cm^3$.

Figure 10:
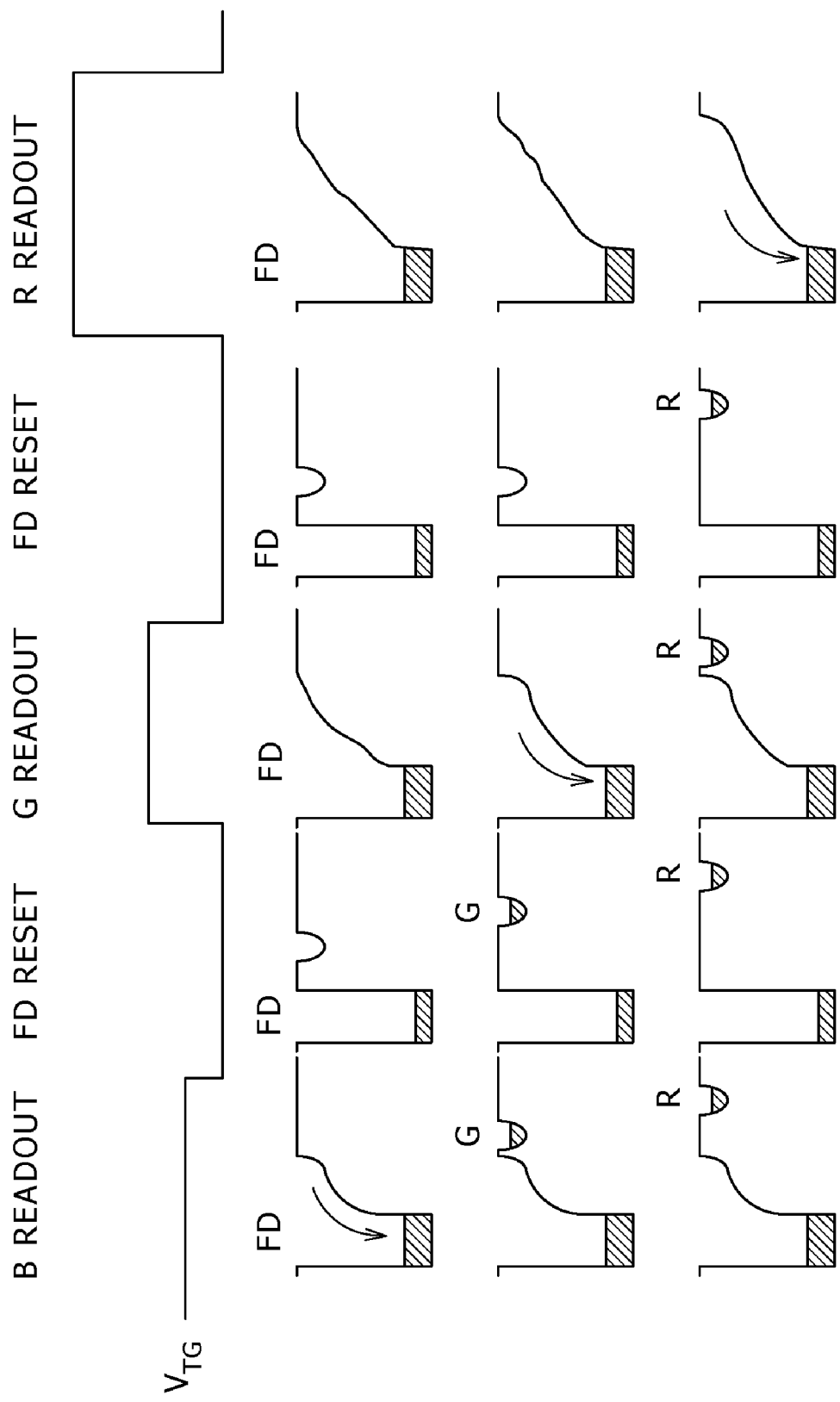
FIG. 10 is a diagram showing potentials in the various regions, the diagram being continued from FIG. 9 and being of assistance in explaining the driving method of the solid-state image pickup element according to the first embodiment.
Figure 11:
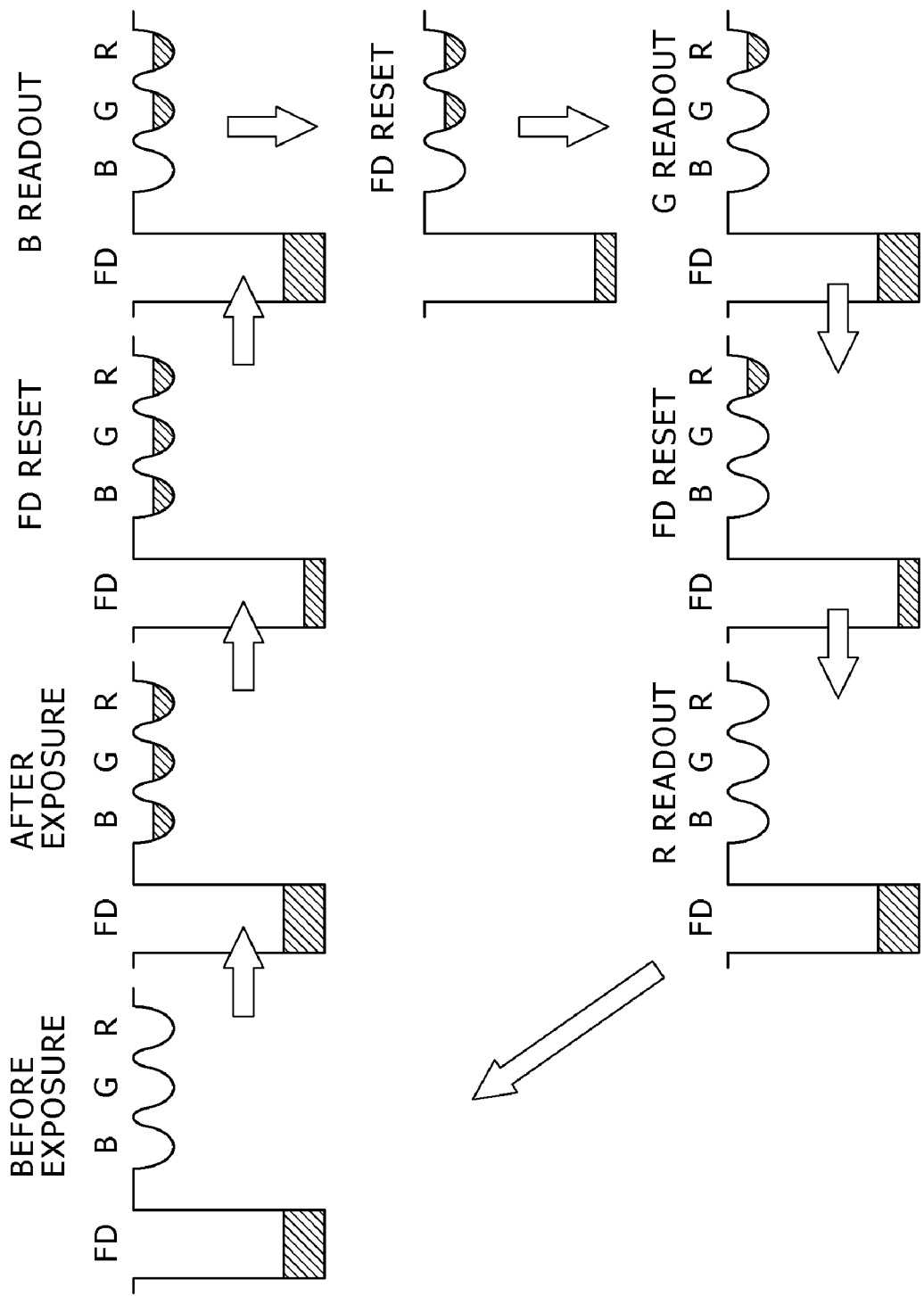
FIG. 11 is a diagram showing potentials in the various regions from a different viewpoint from FIG. 9 or FIG. 10, the diagram being of assistance in explaining the driving method of the solid-state image pickup element according to the first embodiment.

A solid-state image pickup element driving method according to the first embodiment will be described in the following with reference to FIGS. 9 to 11. In the first embodiment, basically, charges accumulated in the light receiving/charge accumulating layers 121, 122, and 123 are sequentially transferred to the charge outputting section 141 via the depletion layer formed in the depletion layer forming region 150 by sequentially applying a control voltage to the control electrode section 161. Incidentally, the absolute value of the control voltage applied to the control electrode section 161 when the charges accumulated in the light receiving/charge accumulating layers 121, 122, and 123 are transferred to the charge outputting section 141 is higher for the light receiving/charge accumulating layer situated at a longer distance from the control electrode region 160 along a direction of a normal to the semiconductor layer 11 (Z-direction). Specifically, the absolute value of the control voltage applied to the control electrode section 161 when the charges accumulated in the light receiving/charge accumulating layers 121, 122, and 123 are transferred to the charge outputting section 141 is higher for the light receiving/charge accumulating layer situated at a deeper position of the semiconductor layer 11.

In FIGS. 9 to 15, "FD" denotes a potential in the charge outputting region or the charge outputting section. "B," "G," and "R" denote potentials in the first light receiving/charge accumulating layer, the second light receiving/charge accumulating layer, and the third light receiving/charge accumulating layer, respectively. "FD reset" denotes initialization (resetting) of the charge outputting region or the charge outputting section. "B readout" denotes the transferring of a charge accumulated in the first light receiving/charge accumulating layer to the charge outputting region or the charge outputting section. "G readout" denotes the transferring of a charge accumulated in the second light receiving/charge accumulating layer (or the first light receiving/charge accumulating layer and the second light receiving/charge accumulating layer) to the charge outputting region or the charge outputting section. "R readout" denotes the transferring of a charge accumulated in the third light receiving/charge accumulating layer (or the first light receiving/charge accumulating layer, the second light receiving/charge accumulating layer, and the third light receiving/charge accumulating layer) to the charge outputting region or the charge outputting section.

[Step-100]

In the solid-state image pickup element driving method according to the first embodiment, first, each of the light receiving/charge accumulating layers 121, 122, and 123 is fully depleted before charge accumulation. Specifically, a charge accumulated in each light receiving/charge accumulating layer is transferred to the charge outputting region (charge outputting section) in a previous operation. At a time of completion of this operation, each of the light receiving/charge accumulating layers 121, 122, and 123 is fully depleted. Thus, such an operation can fully deplete each of the light receiving/charge accumulating layers 121, 122, and 123.

[Step-110]

Thereafter, $V_{FD-B}$=5 volts, for example, is applied to the charge outputting section 141, and $V_{TG-B}$=5 volts is applied to the control electrode section 161 at the same time. Thereby, a so-called reverse bias is applied to each of the light receiving/charge accumulating layers 121, 122, and 123. Charges (electrons in the first embodiment) are accumulated in the respective light receiving/charge accumulating layers 121, 122, and 123 depending on states of light reception in the respective light receiving/charge accumulating layers 121, 122, and 123. However, this step can be omitted.

[Step-120]

After passage of a predetermined exposure time, $V_{FD-reset}$=5 volts, for example, is applied to the charge outputting section 141. However, the value of $V_{FD-reset}$ may be a value other than 5 volts (for example 3 volts of a power supply voltage). Thereby the charge outputting region 140 is initialized (reset).

[Step-130]

Thereafter the charge accumulated in the first light receiving/charge accumulating layer 121 is transferred to the charge outputting region 140 (B readout). Specifically, for example, a control voltage having a first value ($V_{TG-B}$=1 volt) is applied to the control electrode section 161. Thereby, a depletion layer is formed in the depletion layer forming region 150, and this depletion layer reaches the light receiving/charge accumulating layer extending section 121A of the first layer but does not reach the light receiving/charge accumulating layer extending sections 122A and 123A of the second layer and the third layer. As a result, the first light receiving/charge accumulating layer 121 is electrically connected to the charge outputting section 141 via the light receiving/charge accumulating layer extending section 121A of the first layer and the depletion layer, and the charge accumulated in the first light receiving/charge accumulating layer 121 is transferred to the charge outputting region 140. Next, the charge is converted into a voltage in the charge outputting region 140. The voltage is sent out to a well known signal detecting circuit not shown in the figure. Incidentally, in FIG. 9 and FIG. 10, a schematic representation of "B readout" is repeated.

[Step-140]

Next, the charge outputting region 140 is initialized (reset) by performing [Step-120] again. Thereafter the charge accumulated in the second light receiving/charge accumulating layer 122 is transferred to the charge outputting region 140 (G readout). Specifically, for example, the control voltage having a second value ($V_{TG-G}$=2 volts) is applied to the control electrode section 161. Thereby, a depletion layer is formed in the depletion layer forming region 150, and this depletion layer reaches the light receiving/charge accumulating layer extending section 122A of the second layer but does not reach the light receiving/charge accumulating layer extending section 123A of the third layer. As a result, the first light receiving/charge accumulating layer 121 and the second light receiving/charge accumulating layer 122 are electrically connected to the charge outputting section 141 via the light receiving/charge accumulating layer extending sections 121A and 122A of the first layer and the second layer and the depletion layer, and the charge accumulated in the second light receiving/charge accumulating layer 122 is transferred to the charge outputting region 140. Next, the charge is converted into a voltage in the charge outputting region 140. The voltage is sent out to the well known signal detecting circuit not shown in the figure.

[Step-150]

Thereafter, the charge outputting region 140 is initialized (reset) by performing [Step-120] again. Then, the charge accumulated in the third light receiving/charge accumulating layer 123 is transferred to the charge outputting region 140 (R readout). Specifically, for example, the control voltage having a third value ($V_{TG-R}$=5 volts) is applied to the control electrode section 161. Thereby, a depletion layer is formed in the depletion layer forming region 150, and this depletion layer reaches the light receiving/charge accumulating layer extending section 123A of the third layer. As a result, the first light receiving/charge accumulating layer 121, the second light receiving/charge accumulating layer 122, and the third light receiving/charge accumulating layer 123 are electrically connected to the charge outputting section 141 via the light receiving/charge accumulating layer extending sections 121A, 122A, and 123A of the first layer, the second layer, and the third layer and the depletion layer, and the charge accumulated in the third light receiving/charge accumulating layer 123 is transferred to the charge outputting region 140. Next, the charge is converted into a voltage in the charge outputting region 140. The voltage is sent out to the well known signal detecting circuit not shown in the figure.

In the first embodiment, the charge accumulated in the first light receiving/charge accumulating layer 121 is transferred to the charge outputting region 140 in [Step-130]. The charge accumulated in the first light receiving/charge accumulating layer 121 results from reception of blue light, green light, and red light. The charge accumulated in the second light receiving/charge accumulating layer 122 is transferred to the charge outputting region 140 in [Step-140]. The charge accumulated in the second light receiving/charge accumulating layer 122 results from reception of green light and red light. The charge accumulated in the third light receiving/charge accumulating layer 123 is transferred to the charge outputting region 140 in [Step-150]. The charge accumulated in the third light receiving/charge accumulating layer 123 results from reception of red light. Thus, the charges are converted into voltages in the charge outputting region 140, the voltages are sent out to the well known signal detecting circuit not shown in the figure, and the signal detecting circuit performs an operation, whereby an amount of received blue light, an amount of received green light, and an amount of received red light can be obtained. Incidentally, the same is true for the second embodiment or the third embodiment to be described later. Incidentally, when a mechanical shutter mechanism is not provided, the light receiving/charge accumulating region is receiving light also in [Step-130], [Step-140], and [Step-150]. However, the times of [Step-130], [Step-140], and [Step-150] are very short times. Therefore no particular problem is presented.

In the solid-state image pickup element and the solid-state image pickup element driving method according to the first embodiment, the control electrode region 160 for controlling a state of formation of a depletion layer in the depletion layer forming region 150 is provided, and projected images of the respective light receiving/charge accumulating layer extending sections 121A, 122A, and 123A in the depletion layer forming region 150 do not overlap each other and are juxtaposed. Thus, by applying an appropriate control voltage to the control electrode region 160, a depletion layer can be formed in the depletion layer forming region 150, and charges accumulated in the light receiving/charge accumulating layers 121, 122, and 123 can be transferred to the charge outputting region 140 (charge outputting section 141) via the depletion layer. Therefore the size of the solid-state image pickup element as a whole can be reduced.

The solid-state image pickup element according to the first embodiment can be manufactured by a method of forming the semiconductor layer 11 including a p-type impurity on the silicon semiconductor substrate 10 by an epitaxial growth method (an epitaxial growth method in which in-situ doping is performed), thereafter forming the light receiving/charge accumulating layers 121, 122, and 123, the light receiving/charge accumulating layer extending sections 121A, 122A, and 123A, the charge outputting region (floating diffusion region) 140, and the depletion layer forming region 150 by a well known ion implantation method, then forming the insulating film 61 on the surface of the semiconductor layer 11, forming the control electrode region 160 above the depletion layer forming region 150, and forming the smoothing layer 63, the light shielding layer 62, and the smoothing layer 63 over the entire surface.

Alternatively, the solid-state image pickup element according to the first embodiment can also be manufactured by a method to be described below with reference to FIGS. 16A to 16D, FIGS. 17A to 17C, and FIGS. 18A to 18C, which are schematic partial end views of the silicon semiconductor substrate and the like. Incidentally, FIGS. 16A to 16D, FIGS. 17A to 17C, and FIGS. 18A to 18C are schematic partial sectional views similar to that taken along the arrow A-A in FIG. 1B.

[Step-A]

Figure 16A:
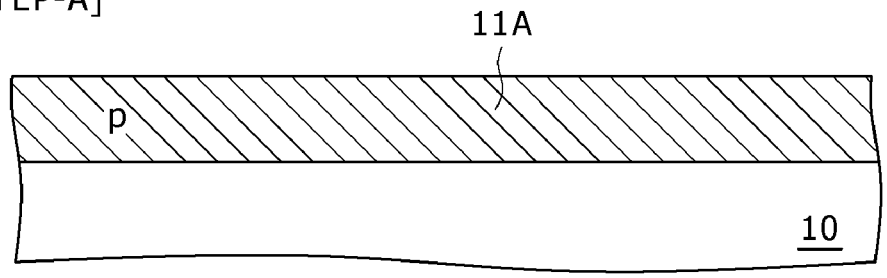
FIGS. 16A, 16B, 16C, and 16D are schematic partial sectional views of a silicon semiconductor substrate and the like, the schematic partial sectional views being of assistance in explaining a method of manufacturing the solid-state image pickup element according to the first embodiment.
Figure 16B:
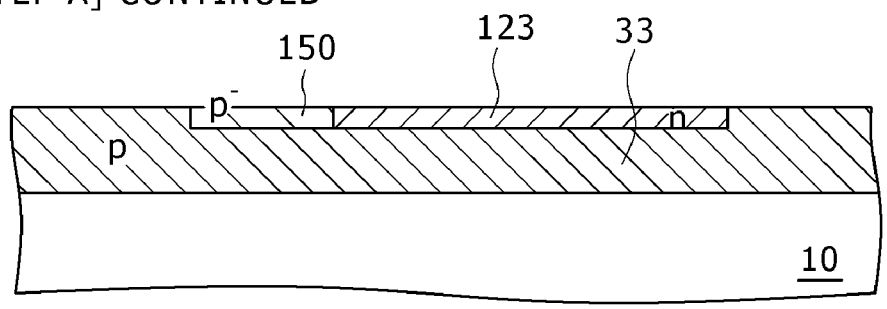

First, a semiconductor layer 11A including a p-type impurity is formed on the silicon semiconductor substrate 10 by an epitaxial growth method (see FIG. 16A). Next, the third light receiving/charge accumulating layer 123 and the depletion layer forming region 150 are formed in the semiconductor layer 11A by a well known ion implantation method (see FIG. 16B). Incidentally, the semiconductor layer 11A corresponds to the lower layer 33.

[Step-B]

Figure 16C:
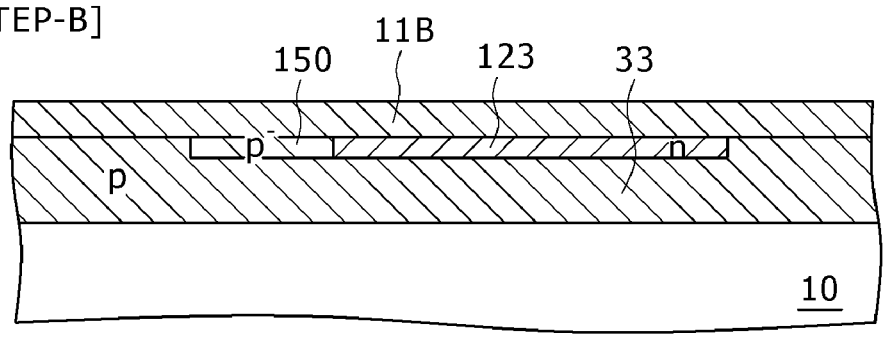
Figure 16D:
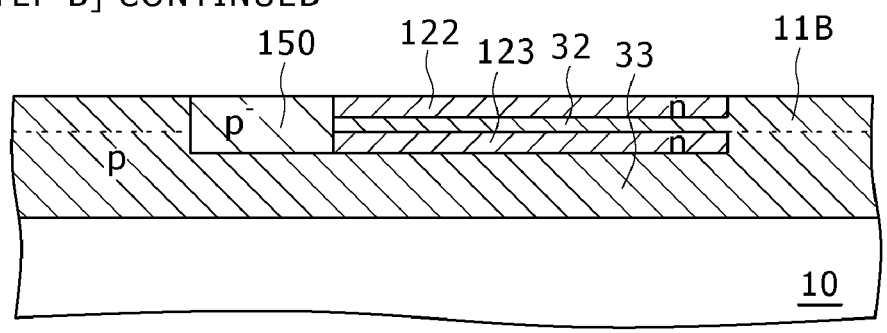

Next, a semiconductor layer 11B including the p-type impurity is formed over the entire surface by the epitaxial growth method (see FIG. 16C). Next, the second light receiving/charge accumulating layer 122 and the depletion layer forming region 150 are formed in a surface region of the semiconductor layer 11B by the well known ion implantation method (see FIG. 16D). Incidentally, the semiconductor layer 11B situated between the second light receiving/charge accumulating layer 122 and the third light receiving/charge accumulating layer 123 corresponds to the upper layer 32 or the lower layer 32.

[Step-C]

Figure 17A:
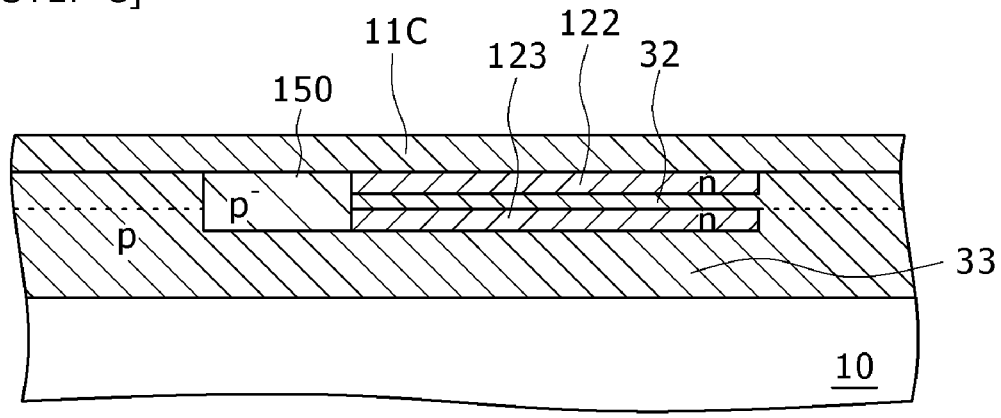
FIGS. 17A, 17B, and 17C are schematic partial sectional views of the silicon semiconductor substrate and the like, the schematic partial sectional views being continued from FIG. 16D and being of assistance in explaining the method of manufacturing the solid-state image pickup element according to the first embodiment.
Figure 17B:
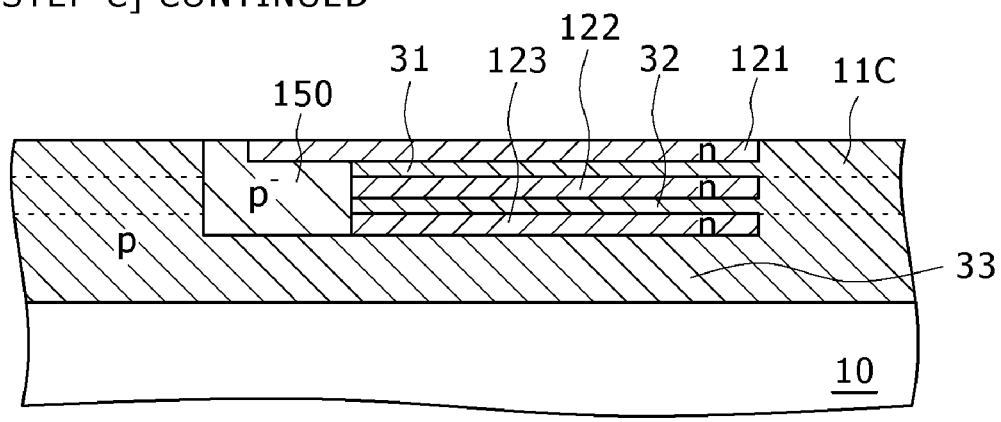

Next, a semiconductor layer 11C including the p-type impurity is formed over the entire surface by the epitaxial growth method (see FIG. 17A). Next, the first light receiving/charge accumulating layer 121 and the depletion layer forming region 150 are formed in a surface region of the semiconductor layer 11C by the well known ion implantation method (see FIG. 17B). Incidentally, the semiconductor layer 11C situated between the first light receiving/charge accumulating layer 121 and the second light receiving/charge accumulating layer 122 corresponds to the upper layer 31 or the lower layer 31.

[Step-D]

Figure 17C:
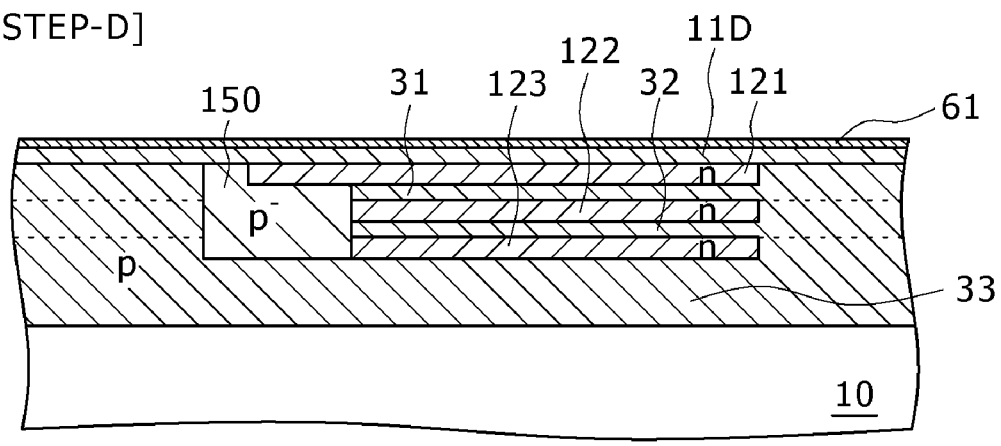

Next, a semiconductor layer 11D including the p-type impurity is formed over the entire surface by the epitaxial growth method, and the insulating film 61 made of $SiO_2$ is formed by oxidizing the surface of the semiconductor layer 11D (see FIG. 17C). Next, the depletion layer forming region 150 is formed in the semiconductor layer 11D by the well known ion implantation method (see FIG. 18A). Incidentally, the semiconductor layer 11D situated between the insulating film 61 and the first light receiving/charge accumulating layer 121 corresponds to the upper layer 30.

[Step-E]

Figure 18A:
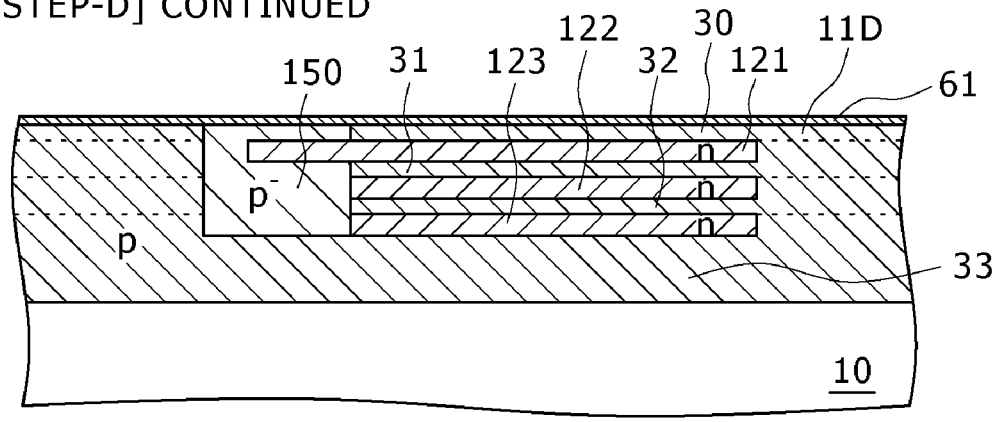
FIGS. 18A, 18B, and 18C are schematic partial sectional views of the silicon semiconductor substrate and the like, the schematic partial sectional views being continued from FIG. 17C and being of assistance in explaining the method of manufacturing the solid-state image pickup element according to the first embodiment.
Figure 18B:
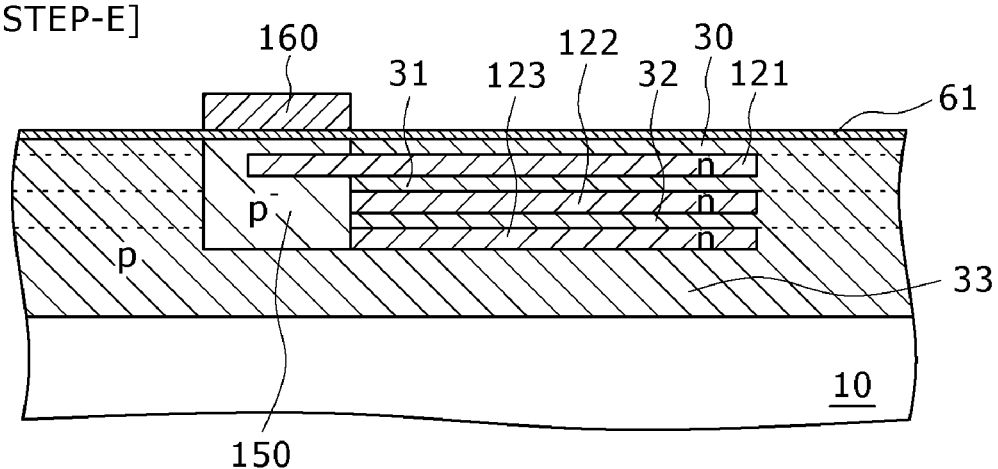

Thereafter, the control electrode region 160 is formed above the depletion layer forming region 150 by a well known method (see FIG. 18B).

[Step-F]

Figure 18C:
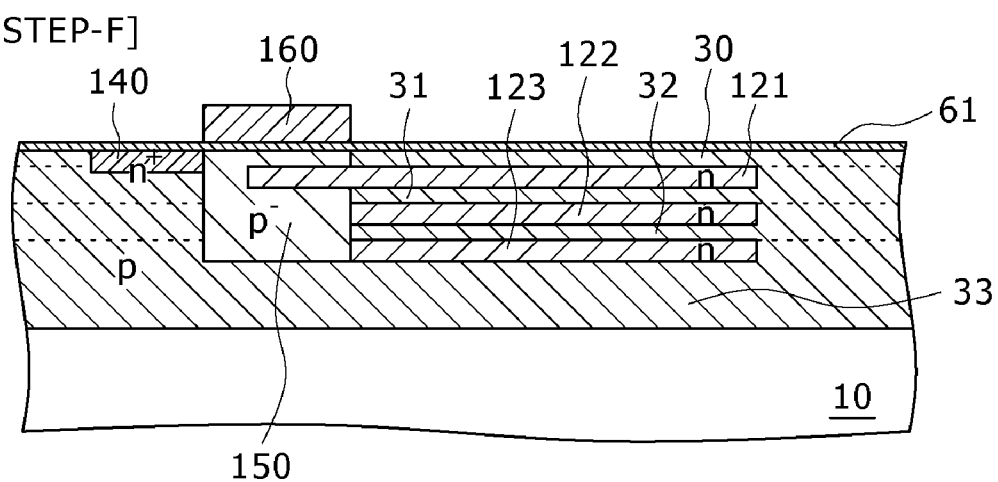

Next, the charge outputting region (floating diffusion region) 140 is formed in the semiconductor layer 11D by a well known ion implantation method (see FIG. 18C).

[Step-G]

Thereafter the smoothing layer 63, the light shielding layer 62, and the smoothing layer 63 are formed over the entire surface. Thereby the solid-state image pickup element according to the first embodiment can be obtained. Incidentally, a solid-state image pickup element according to the second embodiment or the third embodiment to be described later can also be manufactured basically by the above-described method.

Second Embodiment

Figure 4A:
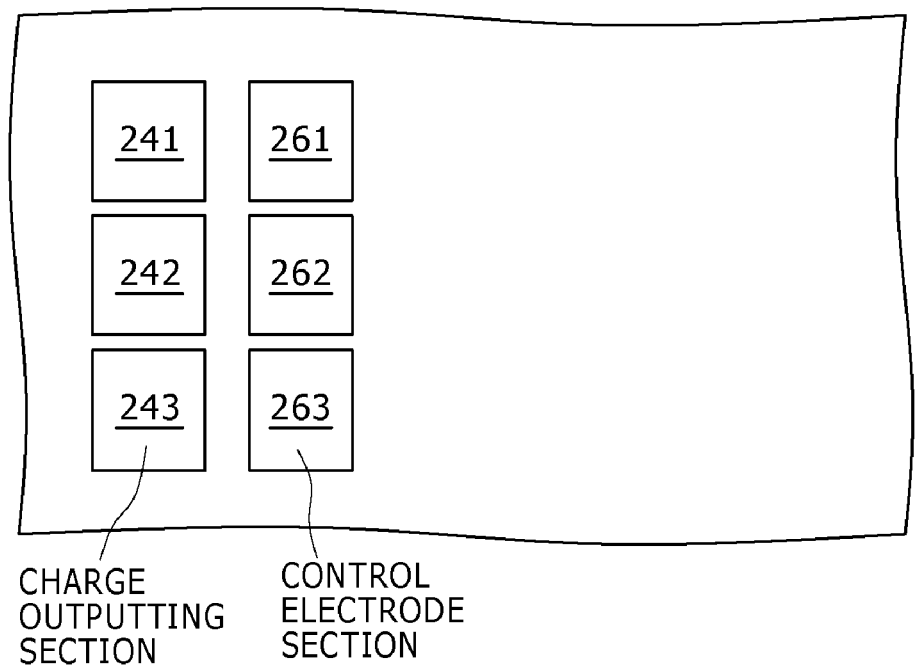
Figure 4B:
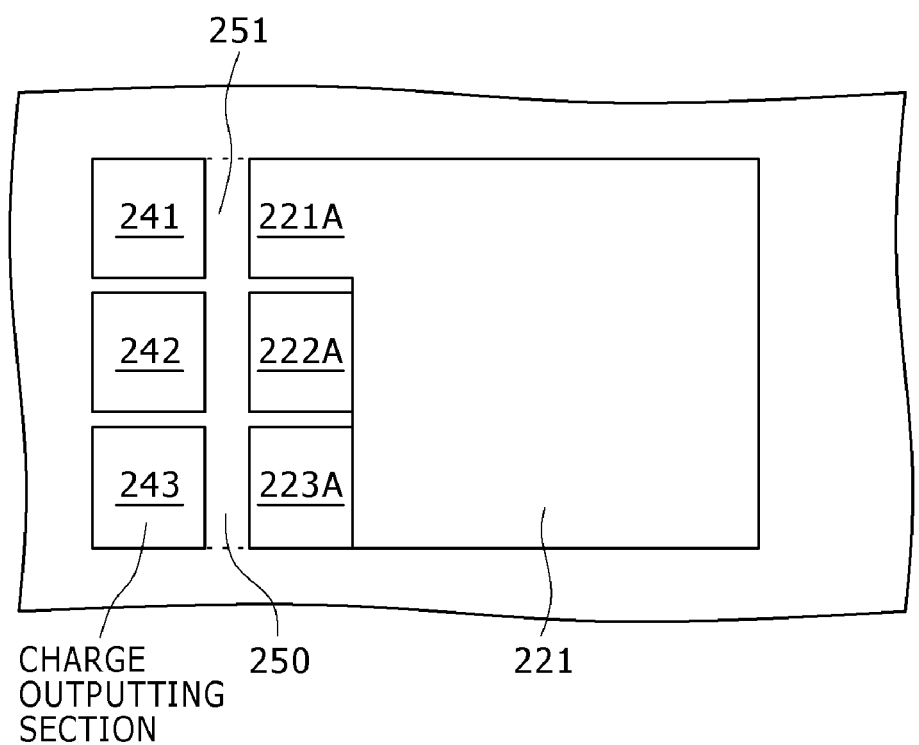
Figure 5A:
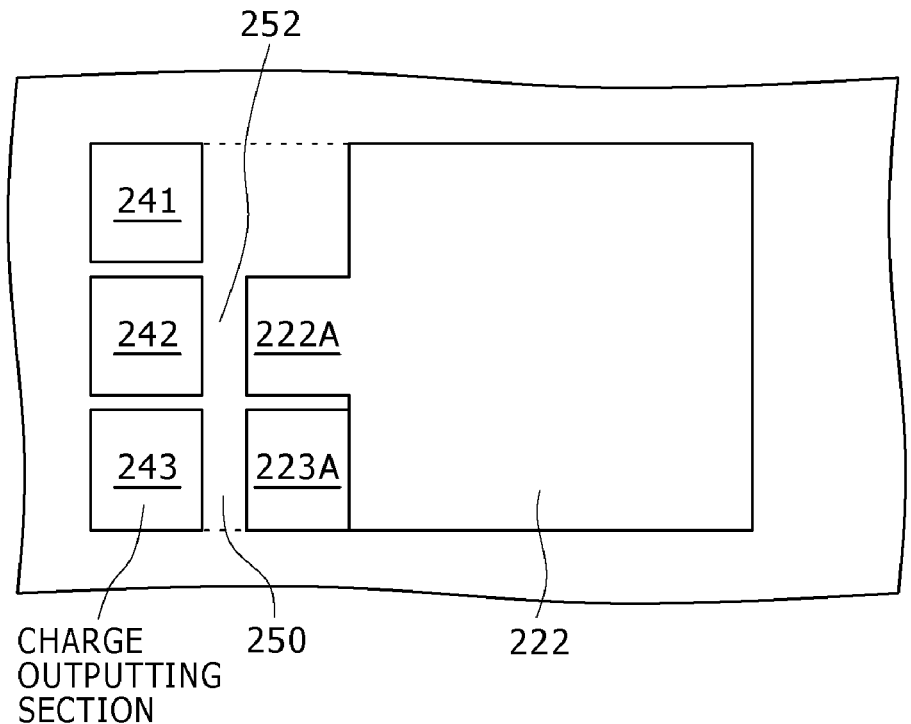
FIGS. 5A and 5B are respectively schematic partial sectional views of a state of arrangement of a second light receiving/charge accumulating layer and a third light receiving/charge accumulating layer and the like in the solid-state image pickup element according to the second embodiment.
Figure 5B:
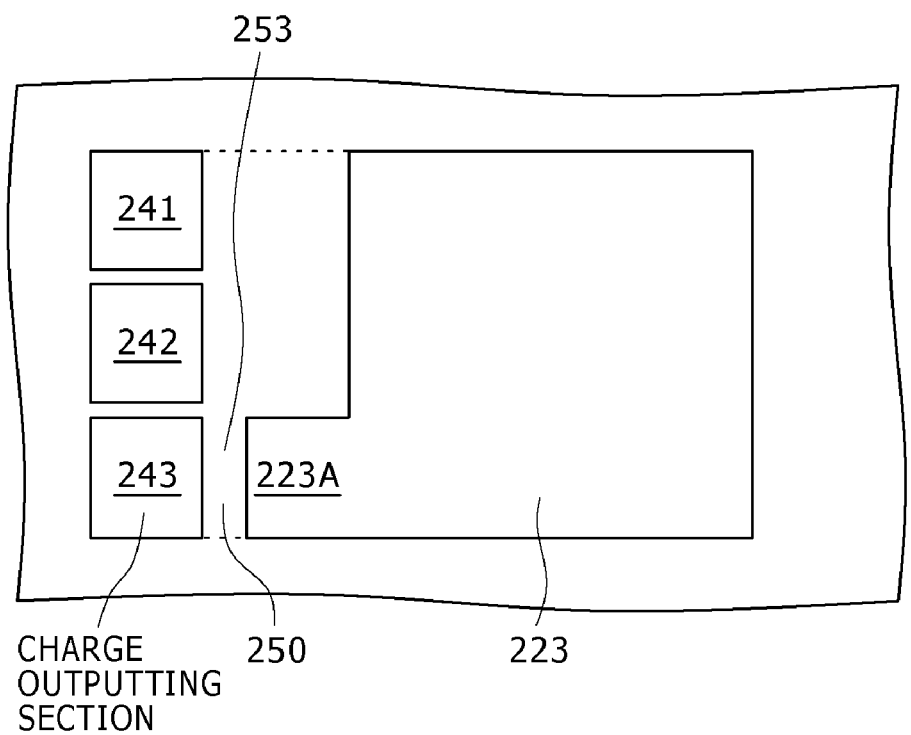

A second embodiment relates to the solid-state image pickup element according to the present invention and the solid-state image pickup element driving method according to the second mode of the present invention. FIG. 4A is a schematic diagram of a state of arrangement of control electrode sections and charge outputting sections in a solid-state image pickup element according to the second embodiment. FIG. 4B and FIGS. 5A and 5B are schematic partial sectional views of a state of arrangement of a first, a second, and a third light receiving/charge accumulating layer and the like.

Also in the second embodiment, projected images of respective light receiving/charge accumulating layer extending sections 221A, 222A, and 223A in a depletion layer forming region 250 do not overlap each other, and are juxtaposed. In addition, as in the first embodiment, thickness of parts 251, 252, and 253 of the depletion layer forming region 250 which parts are situated between the light receiving/charge accumulating layer extending sections 221A, 222A, and 223A and a control electrode region differs according to respective light receiving/charge accumulating layers 221, 222, and 223. Further, the control electrode region 260 includes M (M=3 also in the second embodiment) control electrode sections 261, 262, and 263, and a charge outputting region 240 includes M charge outputting sections (charge retaining sections) 241, 242, and 243. Via a depletion layer formed in the depletion layer forming region 250 on a basis of application of a control voltage to an mth (where $1 \leq m \leq M$) control electrode section (one time of application of varied values of application voltage to the M control electrode sections 261, 262, and 263 in the second embodiment), a charge accumulated in an mth light receiving/charge accumulating layer is transferred to an mth charge outputting section.

As to the thickness of the parts 251, 252, and 253 of the depletion layer forming region 250 which parts are situated between the light receiving/charge accumulating layer extending sections 221A, 222A, and 223A and the control electrode region, the levels of the light receiving/charge accumulating layer extending sections 221A, 222A, and 223A are similar values to those of the foregoing first embodiment. Also in the solid-state image pickup element according to the second embodiment, impurity concentration of the parts 251, 252, and 253 of the depletion layer forming region 250 which parts are situated between the light receiving/charge accumulating layer extending sections 221A, 222A, and 223A and the control electrode region differs depending on the thickness of the parts 251, 252, and 253 of the depletion layer forming region 250 which parts are situated between the light receiving/charge accumulating layer extending sections 221A, 222A, and 223A and the control electrode region. Specifically, as in the first embodiment, impurity concentration of the depletion layer forming region 250 becomes lower with increasing distance from the control electrode region 260 along a direction of a normal to a semiconductor layer 11 (Z-direction) (that is, in a deeper region of the semiconductor layer 11).

A solid-state image pickup element driving method according to the second embodiment will be described in the following with reference to FIGS. 12 and 13. In the second embodiment, basically, a charge accumulated in a light receiving/charge accumulating layer is transferred to a charge outputting section via a depletion layer formed in the depletion layer forming region by applying a control voltage to a control electrode section. Incidentally, in the second embodiment, charges accumulated in the respective light receiving/charge accumulating layers 221, 222, and 223 are simultaneously transferred to the respective charge outputting sections 241, 242, and 243 via depletion layers formed in the depletion layer forming region 250 by simultaneously applying control voltages $V_{TG}$ having different values to the respective control electrode sections 261, 262, and 263. Alternatively, the charges accumulated in the light receiving/charge accumulating layers 221, 222, and 223 may be sequentially transferred to the charge outputting sections 241, 242, and 243 via depletion layers formed in the depletion layer forming region 250 by sequentially applying a control voltage to the control electrode sections 261, 262, and 263. The absolute value of the control voltage applied to the control electrode section 261, 262, or 263 when the charges accumulated in the light receiving/charge accumulating layers 221, 222, and 223 are transferred to the charge outputting sections 241, 242, and 243 is higher for the light receiving/charge accumulating layer situated at a longer distance from the control electrode region 260 along a direction of a normal to the semiconductor layer 11 (Z-direction) (specifically, for the light receiving/charge accumulating layer situated at a deeper position of the semiconductor layer 11).

[Step-200]

Also in the solid-state image pickup element driving method according to the second embodiment, as in [Step-100] in the first embodiment, each of the light receiving/charge accumulating layers 221, 222, and 223 is fully depleted.

[Step-210]

Thereafter, as in [Step-110] in the first embodiment, a so-called reverse bias is applied to each of the light receiving/charge accumulating layers 221, 222, and 223. Charges (electrons also in the second embodiment) are accumulated in the respective light receiving/charge accumulating layers 221, 222, and 223 depending on states of light reception in the respective light receiving/charge accumulating layers 221, 222, and 223.

[Step-220]

After passage of a predetermined exposure time, as in [Step-120] in the first embodiment, $V_{FD\text{-}reset}$ volts, for example, is applied to the first charge outputting section 241, the second charge outputting section 242, and the third charge outputting section 243, and at the same time, $V_{TG\text{-}reset}$ volts is applied to the first control electrode section 261, the second control electrode section 262, and the third control electrode section 263. Thereby the first charge outputting section 241, the second charge outputting section 242, and the third charge outputting section 243 are initialized (reset).

[Step-230]

Figure 12:
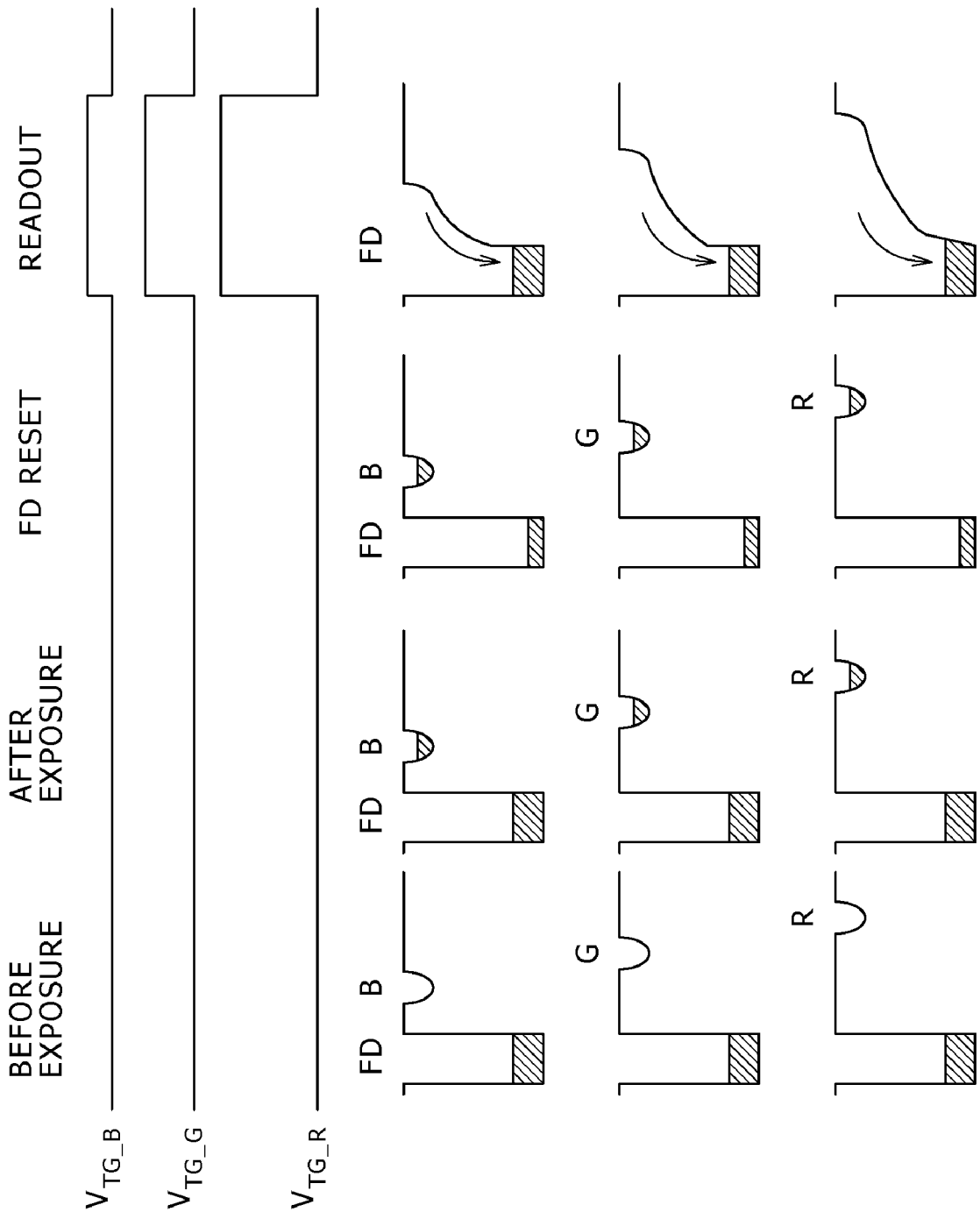
FIG. 12 is a diagram showing potentials in various regions, the diagram being of assistance in explaining a driving method of the solid-state image pickup element according to the second embodiment.
Figure 13:
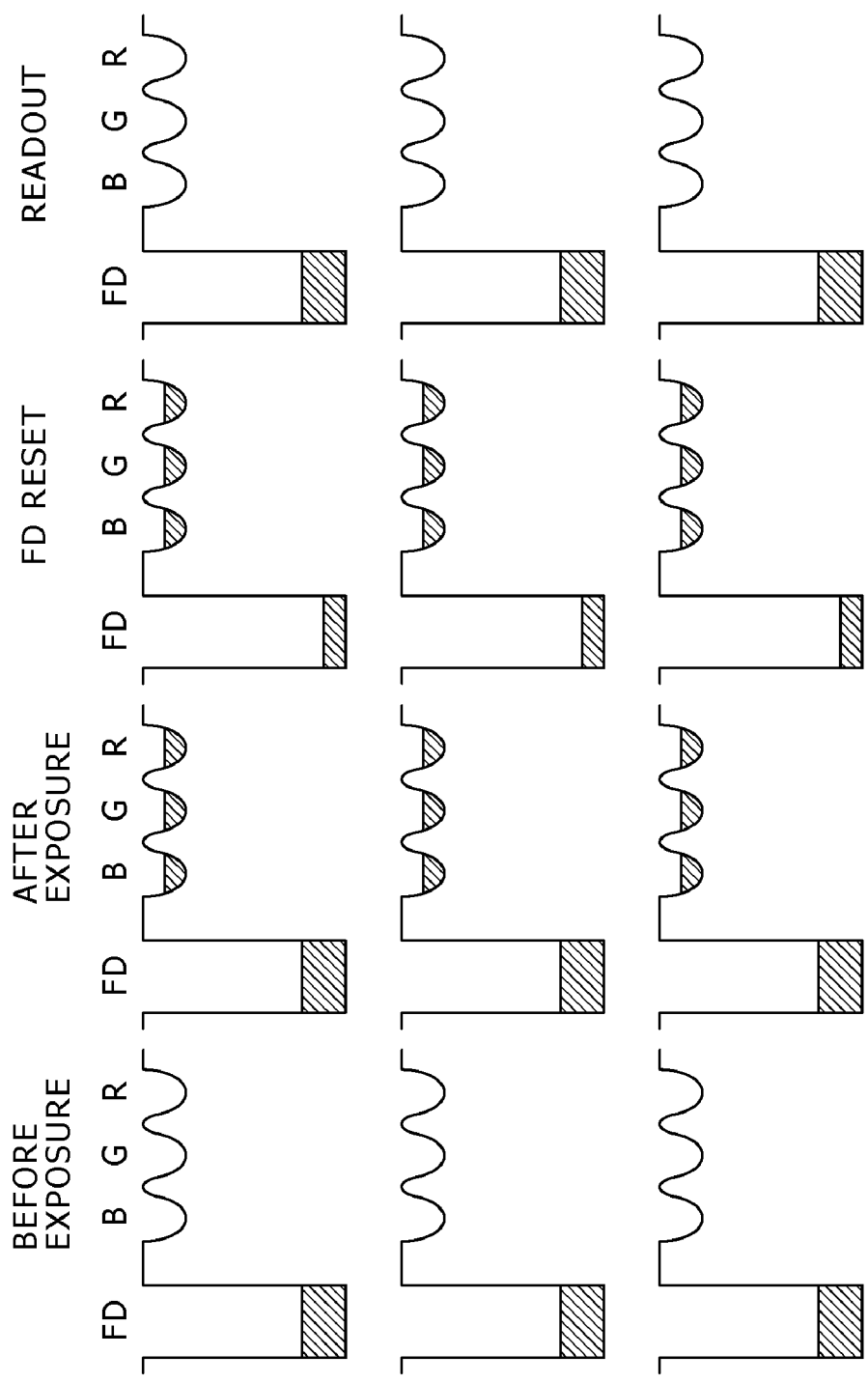
FIG. 13 is a diagram showing potentials in the various regions from a different viewpoint from FIG. 12, the diagram being of assistance in explaining the driving method of the solid-state image pickup element according to the second embodiment.

Thereafter, the charge accumulated in the first light receiving/charge accumulating layer 221 is transferred to the first charge outputting section 241, the charge accumulated in the second light receiving/charge accumulating layer 222 is simultaneously transferred to the second charge outputting section 242, and the charge accumulated in the third light receiving/charge accumulating layer 223 is simultaneously transferred to the third charge outputting section 243 (see "readout" in FIG. 12 and FIG. 13). Specifically, for example, $V_{FD\text{-}B}$ volts is applied to the first charge outputting section 241, and a control voltage $V_{TG\text{-}B}$ having a first value is applied to the first control electrode section 261. At the same time, $V_{FD\text{-}G}$ volts is applied to the second charge outputting section 242, and $V_{TG\text{-}G}$ volts is applied to the second control electrode section 262. At the same time, $V_{FD\text{-}R}$ volts is applied to the third charge outputting section 243, and $V_{TG\text{-}R}$ volts is applied to the third control electrode section 263. Thereby, a depletion layer is formed in the depletion layer forming region 250, and this depletion layer directly under the first control electrode section 261 reaches the light receiving/charge accumulating layer extending section 221A of the first layer but does not reach the light receiving/charge accumulating layer extending sections 222A and 223A of the second layer and the third layer. The depletion layer directly under the second control electrode section 262 reaches the light receiving/charge accumulating layer extending section 222A of the second layer but does not reach the light receiving/charge accumulating layer extending section 223A of the third layer. The depletion layer directly under the third control electrode section 263 reaches the light receiving/charge accumulating layer extending section 223A of the third layer. As a result, the first light receiving/charge accumulating layer 221 is electrically connected to the first charge outputting section 241 via the light receiving/charge accumulating layer extending section 221A of the first layer and the depletion layer, and the charge accumulated in the first light receiving/charge accumulating layer 221 is transferred to the first charge outputting section 241. The second light receiving/charge accumulating layer 222 is electrically connected to the second charge outputting section 242 via the light receiving/charge accumulating layer extending section 222A of the second layer and the depletion layer, and the charge accumulated in the second light receiving/charge accumulating layer 222 is transferred to the second charge outputting section 242. The third light receiving/charge accumulating layer 223 is electrically connected to the third charge outputting section 243 via the light receiving/charge accumulating layer extending section 223A of the third layer and the depletion layer, and the charge accumulated in the third light receiving/charge accumulating layer 223 is transferred to the third charge outputting section 243. Next, the charges are converted into voltages in the charge outputting sections 241, 242, and 243. The voltages are sent out to a well known signal detecting circuit not shown in the figure.

Also in the solid-state image pickup element according to the second embodiment or the solid-state image pickup element driving method according to the second mode of the present invention, the control electrode sections 261, 262, and 263 for controlling a state of formation of a depletion layer in the depletion layer forming region 250 are provided, and projected images of the respective light receiving/charge accumulating layer extending sections 221A, 222A, and 223A in the depletion layer forming region 250 do not overlap each other and are juxtaposed. Thus, by applying an appropriate control voltage to the control electrode sections 261, 262, and 263, a depletion layer can be formed in the depletion layer forming region 250, and charges accumulated in the light receiving/charge accumulating layers 221, 222, and 223 can be simultaneously transferred to the charge outputting sections 241, 242, and 243 via the depletion layer. Therefore the size of the solid-state image pickup element as a whole can be reduced. In addition, because it suffices to apply a control voltage to the control electrode sections 261, 262, and 263 at one time, an operation sequence can be simplified.

Third Embodiment

Figure 6A:
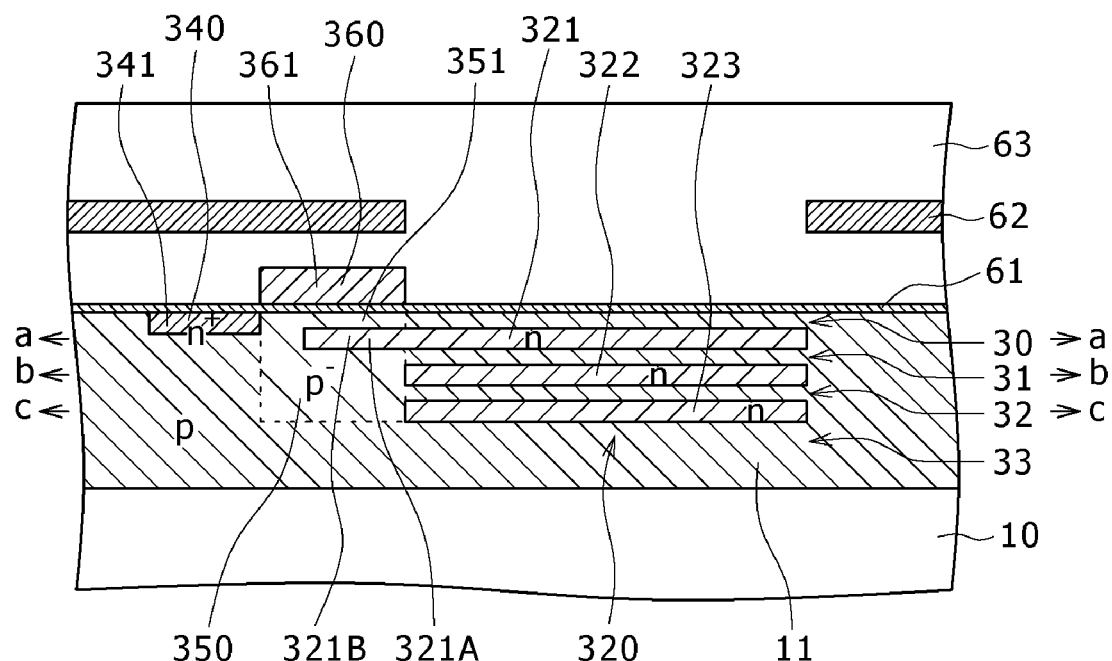
FIGS. 6A and 6B are respectively a schematic partial sectional view of a solid-state image pickup element according to a third embodiment and a schematic partial sectional view of a state of arrangement of a first light receiving/charge accumulating layer and the like, and FIG. 6A is a schematic partial sectional view taken along an arrow A-A in FIG. 6B.
Figure 6B:
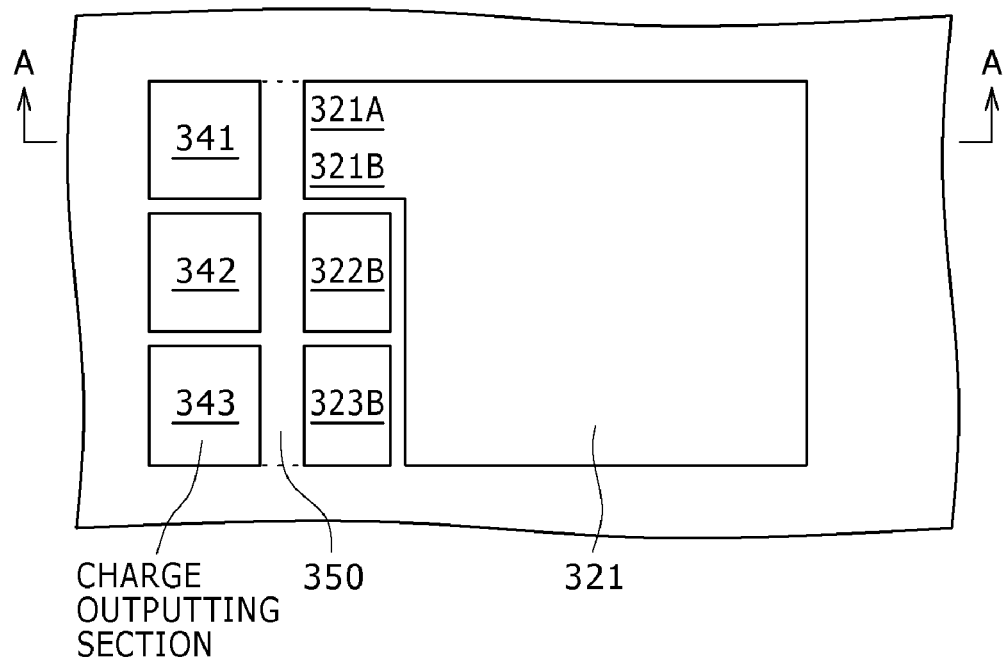
Figure 7A:
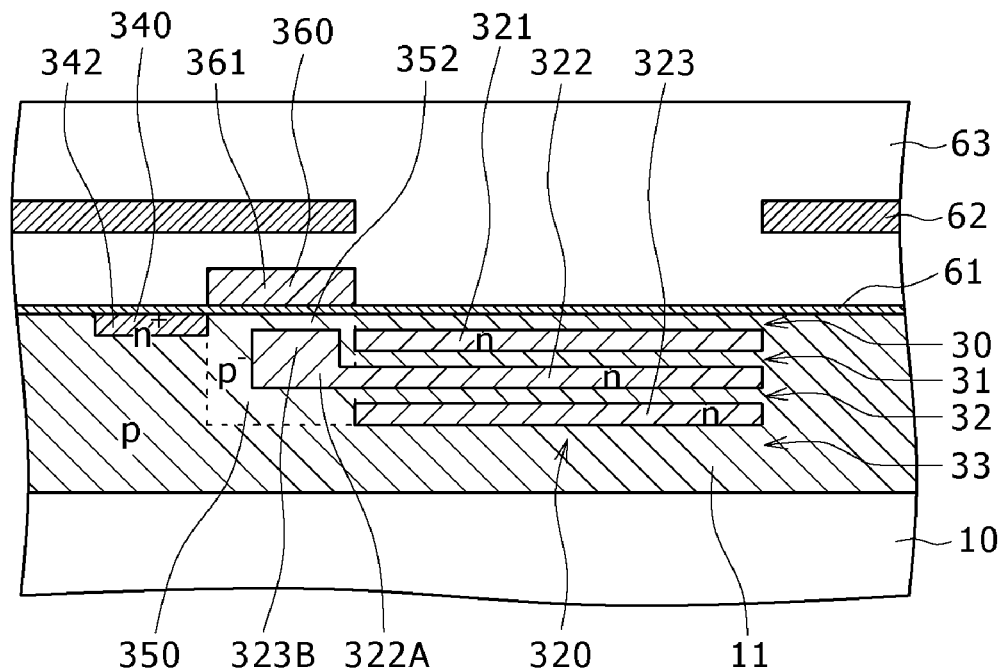
FIGS. 7A and 7B are respectively a schematic partial sectional view of the solid-state image pickup element according to the third embodiment and a schematic partial sectional view of a state of arrangement of a second light receiving/charge accumulating layer and the like, and FIG. 7A is a schematic partial sectional view taken along an arrow A-A in FIG. 7B.
Figure 7B:
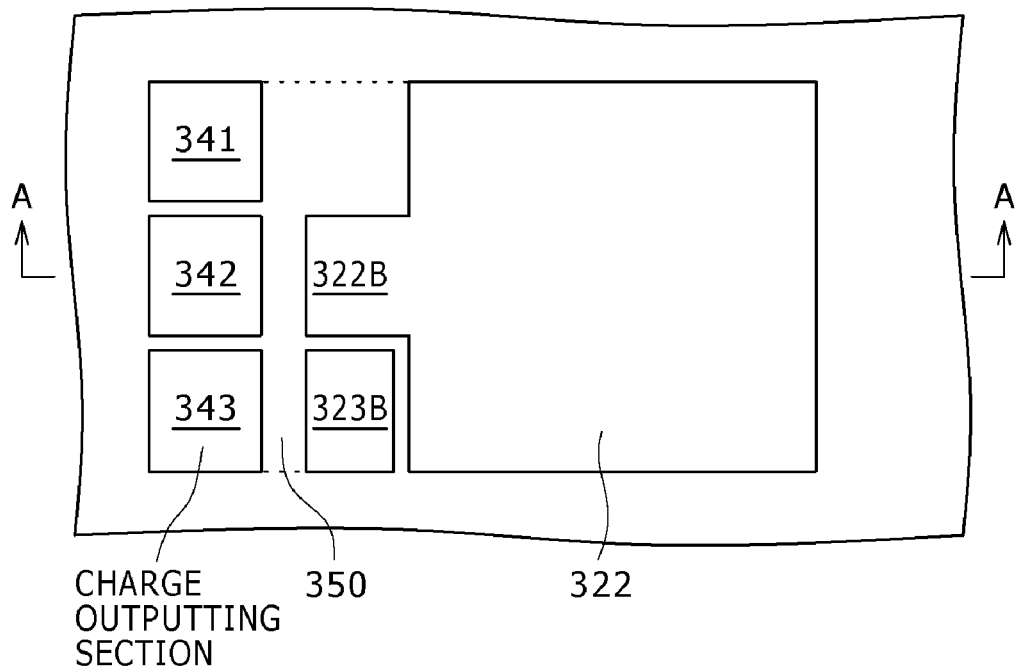
Figure 8A:
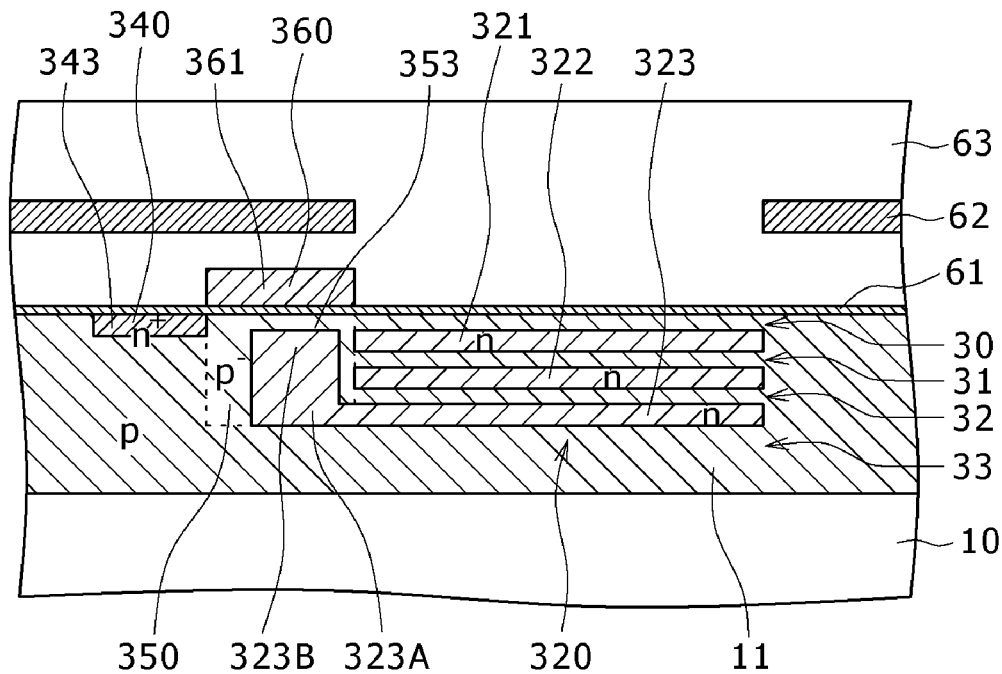
FIGS. 8A and 8B are respectively a schematic partial sectional view of the solid-state image pickup element according to the third embodiment and a schematic partial sectional view of a state of arrangement of a third light receiving/charge accumulating layer and the like, and FIG. 8A is a schematic partial sectional view taken along an arrow A-A in FIG. 8B.
Figure 8B:
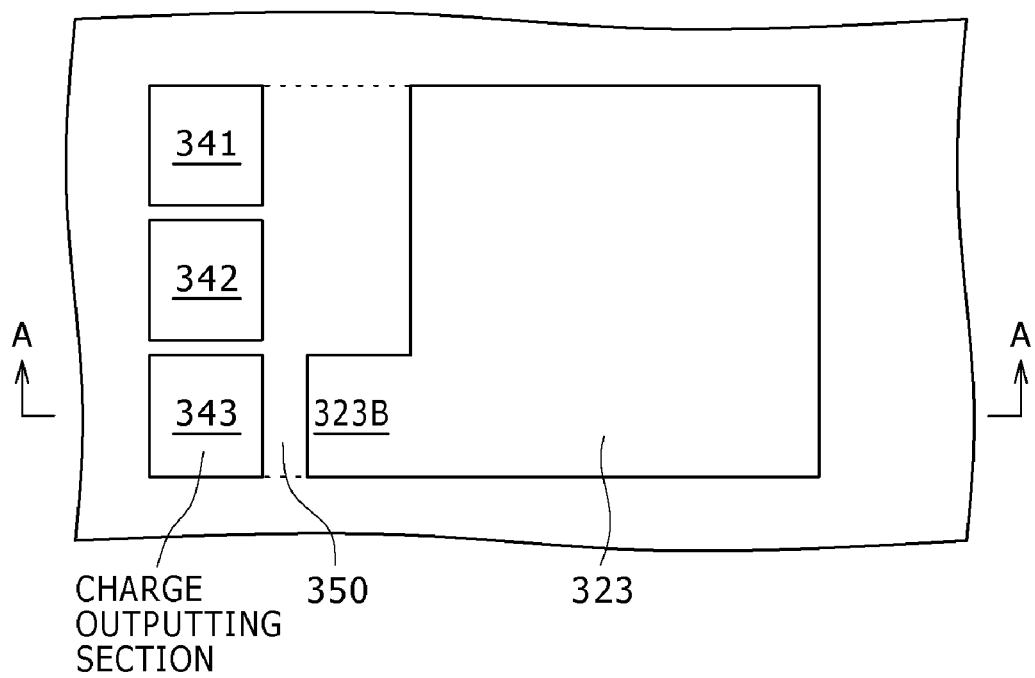

A third embodiment relates to the solid-state image pickup element according to the present invention and the solid-state image pickup element driving method according to the third mode of the present invention. FIG. 6A, FIG. 7A, and FIG. 8A are schematic partial sectional views of a solid-state image pickup element according to the third embodiment. FIG. 6B, FIG. 7B, and FIG. 8B are schematic partial sectional views of a state of arrangement of a first, a second, and a third light receiving/charge accumulating layer and the like. Incidentally, FIG. 6A, FIG. 7A, and FIG. 8A are schematic partial sectional views taken along an arrow A-A in FIG. 6B, FIG. 7B, and FIG. 8B. FIG. 6B, FIG. 7B, and FIG. 8B are schematic partial sectional views of a state of arrangement of the light receiving/charge accumulating layers and the like taken along arrows a-a, b-b, and c-c in FIG. 6A.

Also in the third embodiment, projected images of respective light receiving/charge accumulating layer extending sections 321A, 322A, and 323A in a depletion layer forming region 350 do not overlap each other, and are juxtaposed. However, thickness of parts 351, 352, and 353 of the depletion layer forming region 350 which parts are situated between the light receiving/charge accumulating layer extending sections 321A, 322A, and 323A and a control electrode region is the same in respective light receiving/charge accumulating layers 321, 322, and 323. A control electrode region 360 includes one control electrode section 361, and a charge outputting region 340 includes M charge outputting sections (charge retaining sections) 341, 342, and 343. Via a depletion layer formed in the depletion layer forming region 350 on a basis of application of a control voltage to the control electrode section 361 (that is, one time of application of the control voltage), a charge accumulated in an mth (where $1 \leq m \leq M$) light receiving/charge accumulating layer is transferred to an mth charge outputting section.

As to the thickness of the parts 351, 352, and 353 of the depletion layer forming region 350 which parts are situated between the light receiving/charge accumulating layer extending sections 321A, 322A, and 323A and the control electrode region, the levels of parts 321B, 322B, and 323B of the light receiving/charge accumulating layer extending sections 321A, 322A, and 323A which parts are closest to the control electrode region 360 are the same level as that of the light receiving/charge accumulating layer extending section 121A of the first light receiving/charge accumulating layer 121 in the foregoing first embodiment. Incidentally, in the solid-state image pickup element according to the third embodiment, unlike the first embodiment or the second embodiment, impurity concentration of the parts 351, 352, and 353 of the depletion layer forming region 350 which parts are situated between the light receiving/charge accumulating layer extending sections 321A, 322A, and 323A and the control electrode region is the same (constant). Specifically, impurity concentration of the parts 351, 352, and 353 of the depletion layer forming region 350 is the same as the impurity concentration of the part 151 of the depletion layer forming region 150 which part is situated at the same level as the light receiving/charge accumulating layer extending section of the first light receiving/charge accumulating layer in the first embodiment.

A solid-state image pickup element driving method according to the third embodiment will be described in the following with reference to FIGS. 14 and 15. In the third embodiment, basically, charges accumulated in the light receiving/charge accumulating layers are simultaneously transferred to the charge outputting sections via a depletion layer formed in the depletion layer forming region by applying a control voltage to the control electrode section.

[Step-300]

Also in the solid-state image pickup element driving method according to the third embodiment, as in [Step-100] in the first embodiment, first, each of the light receiving/charge accumulating layers 321, 322, and 323 is fully depleted before charge accumulation.

[Step-310]

Thereafter, as in [Step-110] in the first embodiment, a so-called reverse bias is applied to each of the light receiving/charge accumulating layers 321, 322, and 323. Charges (electrons also in the third embodiment) are accumulated in the respective light receiving/charge accumulating layers 321, 322, and 323 depending on states of light reception in the respective light receiving/charge accumulating layers 321, 322, and 323.

[Step-320]

After passage of a predetermined exposure time, as in [Step-120] in the first embodiment, $V_{FD\text{-}reset}$ volts, for example, is applied to the first charge outputting section 341, the second charge outputting section 342, and the third charge outputting section 343, and at the same time, $V_{TG\text{-}reset}$ volts is applied to the control electrode section 361. Thereby the first charge outputting section 341, the second charge outputting section 342, and the third charge outputting section 343 are initialized (reset).

[Step-330]

Figure 14:
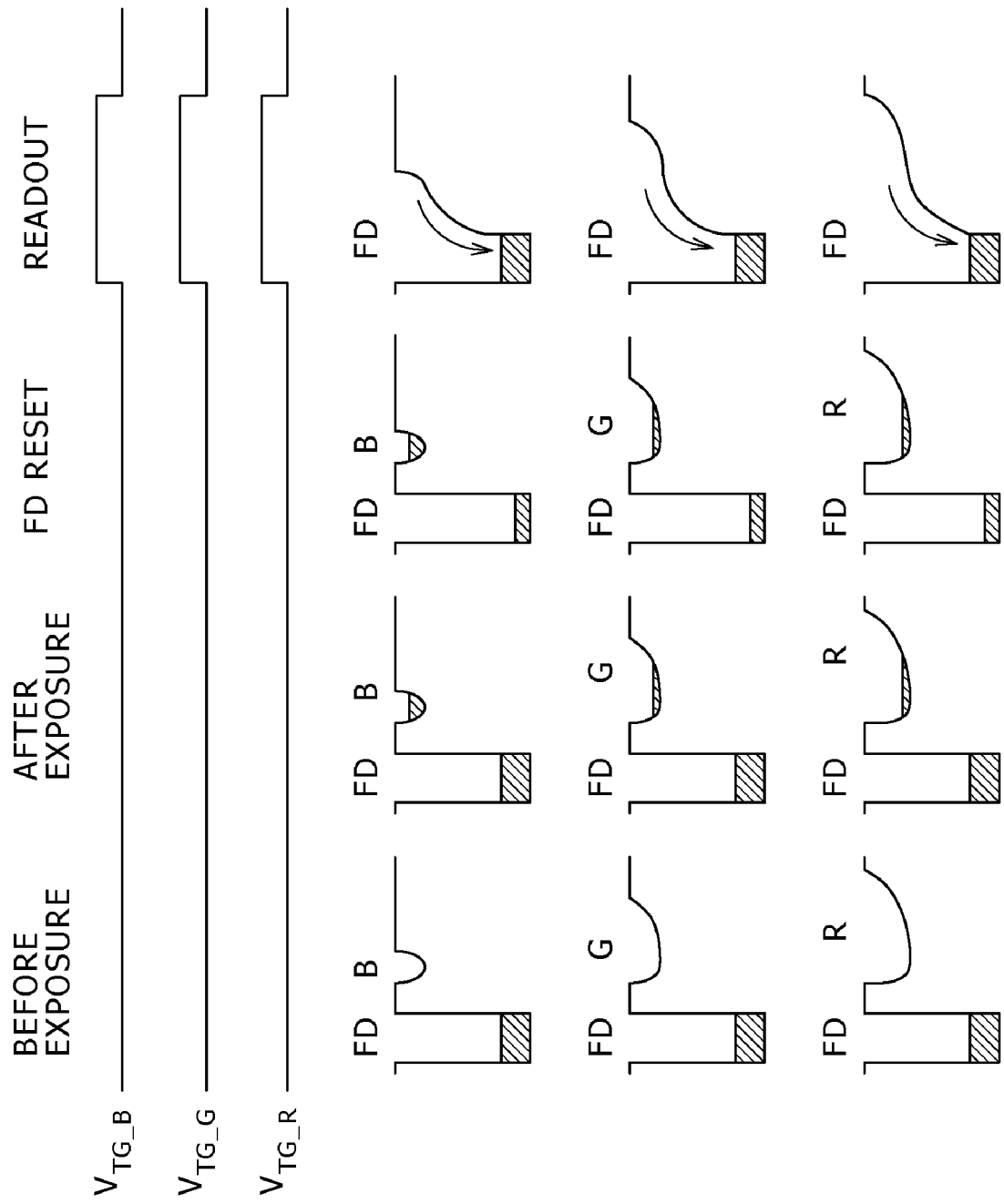
FIG. 14 is a diagram showing potentials in various regions, the diagram being of assistance in explaining a driving method of the solid-state image pickup element according to the third embodiment.
Figure 15:
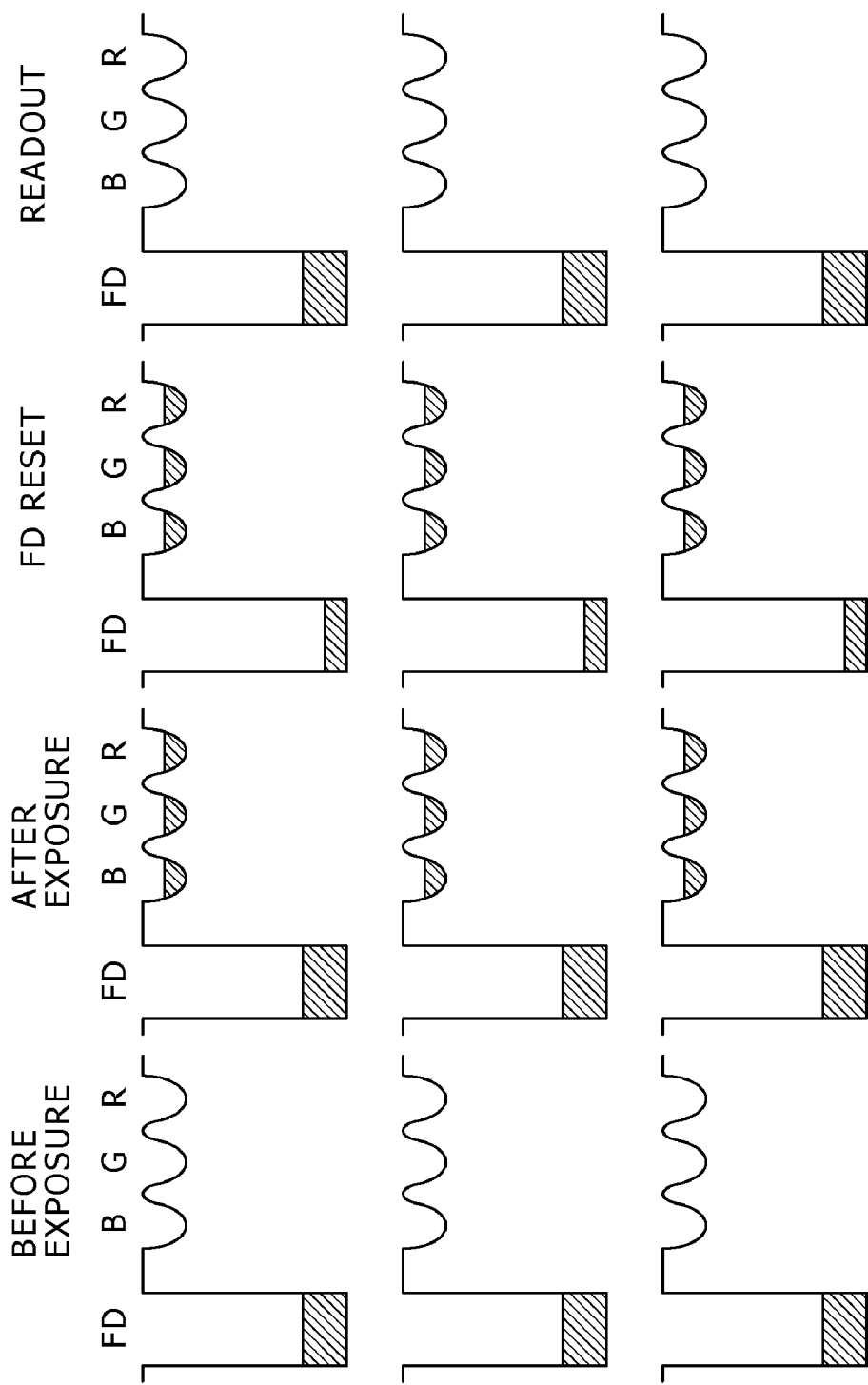
FIG. 15 is a diagram showing potentials in the various regions from a different viewpoint from FIG. 14, the diagram being of assistance in explaining the driving method of the solid-state image pickup element according to the third embodiment.

Thereafter, the charge accumulated in the first light receiving/charge accumulating layer 321 is transferred to the first charge outputting section 341, the charge accumulated in the second light receiving/charge accumulating layer 322 is simultaneously transferred to the second charge outputting section 342, and the charge accumulated in the third light receiving/charge accumulating layer 323 is simultaneously transferred to the third charge outputting section 343 (see "readout" in FIG. 14 and FIG. 15). Specifically, for example, $V_{FD\text{-}B}$ volts is simultaneously applied to the first charge outputting section 341, the second charge outputting section 342, and the third charge outputting section 343, and a control voltage of $V_{TG\text{-}B}$ volts is applied to the control electrode section 361 at the same time. Thereby, a depletion layer is formed in the depletion layer forming region 350, and this depletion layer reaches the part 321B of the light receiving/charge accumulating layer extending section 321A of the first layer, the part 322B of the light receiving/charge accumulating layer extending section 322A of the second layer, and the part 323B of the light receiving/charge accumulating layer extending section 323A of the third layer. As a result, the first light receiving/charge accumulating layer 321 is electrically connected to the first charge outputting section 341 via the light receiving/charge accumulating layer extending section 321A and 321B of the first layer and the depletion layer, and the charge accumulated in the first light receiving/charge accumulating layer 321 is transferred to the first charge outputting section 341. At the same time, the second light receiving/charge accumulating layer 322 is electrically connected to the second charge outputting section 342 via the light receiving/charge accumulating layer extending section 322A and 322B of the second layer and the depletion layer, and the charge accumulated in the second light receiving/charge accumulating layer 322 is transferred to the second charge outputting section 342. Further, the third light receiving/charge accumulating layer 323 is electrically connected to the third charge outputting section 343 via the light receiving/charge accumulating layer extending section 323A and 323B of the third layer and the depletion layer, and the charge accumulated in the third light receiving/charge accumulating layer 323 is transferred to the third charge outputting section 343. Next, the charges are converted into voltages in the charge outputting sections 341, 342, and 343. The voltages are sent out to a well known signal detecting circuit not shown in the figure.

Also in the solid-state image pickup element according to the third embodiment or the solid-state image pickup element driving method according to the third mode of the present invention, the control electrode section 361 for controlling a state of formation of a depletion layer in the depletion layer forming region 350 is provided, and projected images of the respective light receiving/charge accumulating layer extending sections 321A, 322A, and 323A in the depletion layer forming region 350 do not overlap each other and are juxtaposed. Thus, by applying an appropriate control voltage to the control electrode section 361, a depletion layer can be formed in the depletion layer forming region 350, and charges accumulated in the light receiving/charge accumulating layers 321, 322, and 323 can be simultaneously transferred to the charge outputting sections 341, 342, and 343 via the depletion layer. Therefore the size of the solid-state image pickup element as a whole can be reduced. In addition, because it suffices to apply a control voltage to the control electrode section 361 at one time, an operation sequence can be simplified.

While the present invention has been described on the basis of preferred embodiments, the present invention is not limited to these embodiments. The constitutions and structures of the solid-state image pickup elements described in the embodiments are illustrative, and can be changed as appropriate. While the light receiving/charge accumulating layer extending sections are juxtaposed in the embodiments, the present invention is not limited to this. A constitution or structure may be formed in which a light receiving/charge accumulating layer is of a rectangular plane shape and light receiving/charge accumulating layer extending sections extend from three sides of the light receiving/charge accumulating layer of the rectangular shape. The number of M is not limited to three, but may be two, or four or more.

Figure 19:
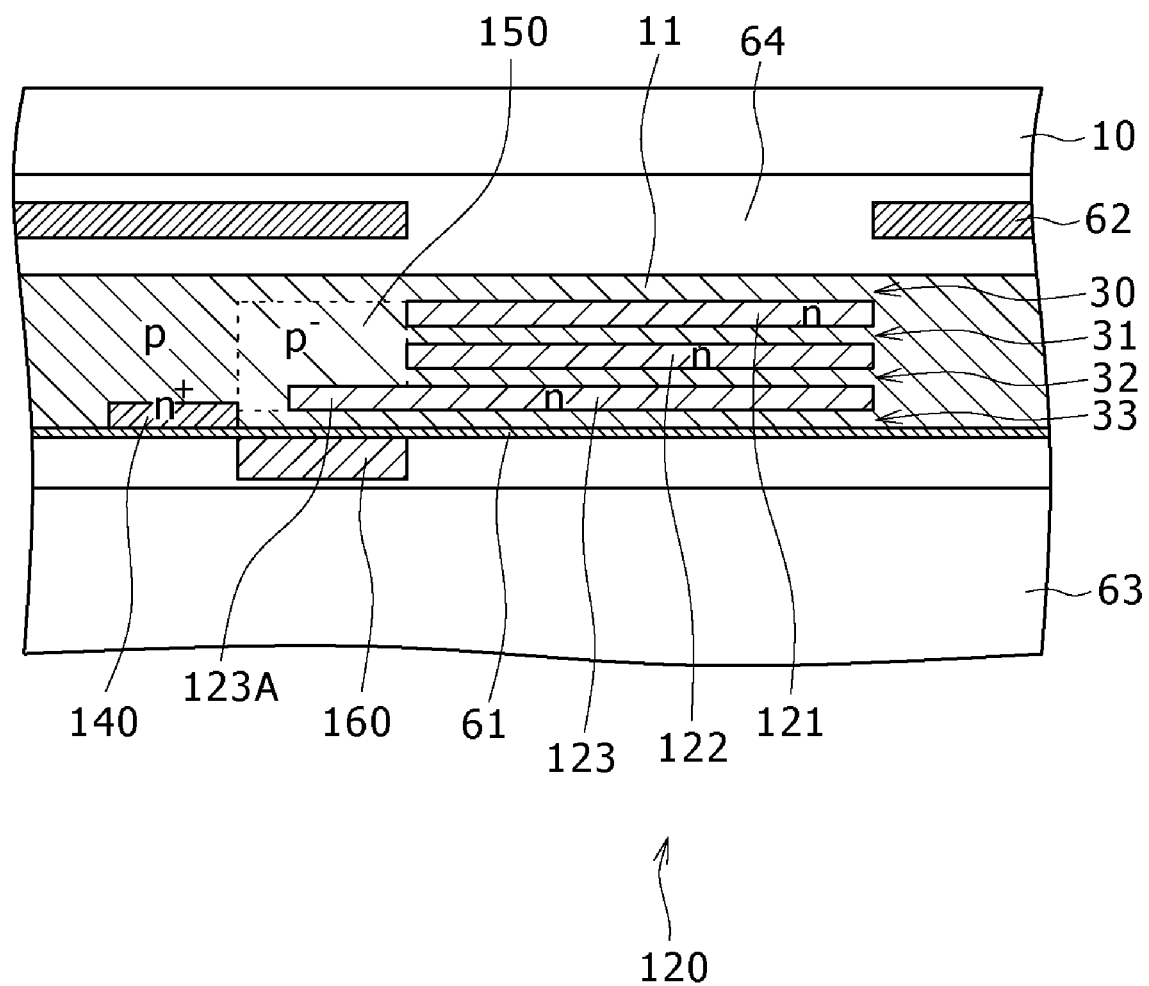
FIG. 19 is a schematic partial sectional view of a solid-state image pickup element formed by changing the structure of the solid-state image pickup element according to the first embodiment to a back-illuminated type.

While only a front-illuminated type solid-state image pickup element has been described in the embodiments, the solid-state image pickup element can be of a back-illuminated type. Specifically, for example, when the solid-state image pickup element described in the first embodiment is changed to a back-illuminated type, as shown in FIG. 19, light is made incident from a silicon semiconductor substrate 10. An insulating layer 64 and a light shielding layer 62 are formed on the silicon semiconductor substrate 10, and further a semiconductor layer 11 is formed. Light receiving/charge accumulating layers 121, 122, and 123, light receiving/charge accumulating layer extending sections 121A, 122A, and 123A, a charge outputting region (floating diffusion region) 140, and a depletion layer forming region 150 are formed in the semiconductor layer 11. Further, an insulating film 61 is formed on the surface of the semiconductor layer 11, a control electrode region 160 is formed below the depletion layer forming region 150, and a smoothing layer 63 is formed.

Figure 20:
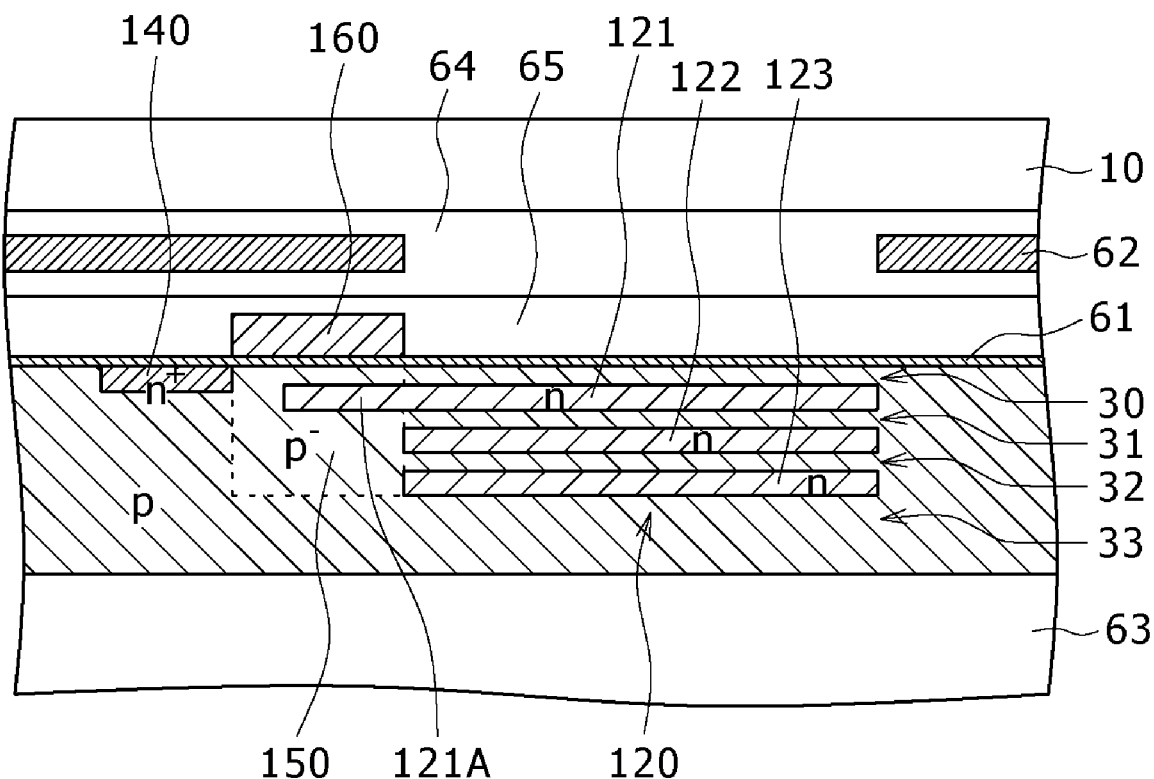
FIG. 20 is a schematic partial sectional view of an example of modification of the solid-state image pickup element formed by changing the structure of the solid-state image pickup element according to the first embodiment to a back-illuminated type.

Incidentally, the control electrode region 160 is disposed below the third light receiving/charge accumulating layer. Alternatively, as shown in FIG. 20, the control electrode region 160 may be formed above the first light receiving/charge accumulating layer. Incidentally, in FIG. 20, a reference numeral 65 denotes an insulating layer.

The present application contains subject matter related to that disclosed in Japanese Priority Patent Application JP 2009-003164 filed in the Japan Patent Office on Jan. 9, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup element comprising:
   (A) a light receiving/charge accumulating region formed in a semiconductor layer and formed by laminating M (where $M \geq 2$) light receiving/charge accumulating layers;
   (B) a charge outputting region formed in the semiconductor layer;
   (C) a depletion layer forming region formed of a part of the semiconductor layer, the part of the semiconductor layer being situated between the light receiving/charge accumulating region and the charge outputting region; and
   (D) a control electrode region for controlling a state of formation of a depletion layer in the depletion layer forming region, wherein
   the solid-state image pickup element further includes a light receiving/charge accumulating layer extending section extending from each light receiving/charge accumulating layer to the depletion layer forming region.

2. The solid-state image pickup element according to claim 1, wherein
   the depletion layer forming region has a first conductivity type,
   the charge outputting region, the light receiving/charge accumulating layers, and the light receiving/charge accumulating layer extending section have a second conductivity type, and
   the light receiving/charge accumulating layers are interposed between an upper layer and a lower layer having the first conductivity type.

3. The solid-state image pickup element according to claim 1, wherein
   the control electrode region includes one control electrode section,
   the charge outputting region includes one charge outputting section, and
   via a depletion layer formed in the depletion layer forming region on a basis of application of a control voltage having an mth (where $1 \leq m \leq M$) value to the control electrode section, a charge accumulated in an mth light receiving/charge accumulating layer is transferred to the charge outputting section.

4. The solid-state image pickup element according to claim 1, wherein
   thickness of a part of the depletion layer forming region, the part of the depletion layer forming region being situated between the light receiving/charge accumulating layer extending section and the control electrode region, differs according to each light receiving/charge accumulating layer, the control electrode region includes M control electrode sections, the charge outputting region includes M charge outputting sections, and via a depletion layer formed in the depletion layer forming region on a basis of application of a control voltage to an mth (where $1 \leq m \leq M$) control electrode section, a charge accumulated in an mth light receiving/charge accumulating layer is transferred to an mth charge outputting section.

5. The solid-state image pickup element according to claim 1, wherein projected images of respective light receiving/charge accumulating layer extending sections in the depletion layer forming region do not overlap each other.

6. The solid-state image pickup element according to claim 5, wherein thickness of a part of the depletion layer forming region, the part of the depletion layer forming region being situated between the light receiving/charge accumulating layer extending sections and the control electrode region, is identical at each light receiving/charge accumulating layer, the control electrode region includes one control electrode section, the charge outputting region includes M charge outputting sections, and via a depletion layer formed in the depletion layer forming region on a basis of application of a control voltage to the control electrode section, a charge accumulated in an mth (where $1 \leq m \leq M$) light receiving/charge accumulating layer is transferred to an mth charge outputting section.

7. The solid-state image pickup element according to claim 1, wherein each light receiving/charge accumulating layer is fully depleted before charge accumulation.

8. The solid-state image pickup element according to claim 1, wherein impurity concentration of the depletion layer forming region is lowered with increasing distance from the control electrode region along a direction of a normal to the semiconductor layer.

9. The solid-state image pickup element according to claim 1, wherein an absolute value of a control voltage applied to the control electrode region when a charge accumulated in a light receiving/charge accumulating layer is transferred to a charge outputting section is higher for the light receiving/charge accumulating layer situated at a longer distance from the control electrode region along a direction of a normal to the semiconductor layer.

10. The solid-state image pickup element according to claim 1, wherein impurity concentration of a part of the depletion layer forming region, the part of the depletion layer forming region being situated between the light receiving/charge accumulating layer extending section and the control electrode region, differs depending on thickness of the part of the depletion layer forming region, the part of the depletion layer forming region being situated between the light receiving/charge accumulating layer extending section and the control electrode region.

11. The solid-state image pickup element according to claim 1, wherein when a charge is an electron, at a time of transferring a charge accumulated in a light receiving/charge accumulating layer to the charge outputting region, potential of the charge outputting region with respect to electrons is lower than potential of the depletion layer, and the potential of the depletion layer is lower than potential of the light receiving/charge accumulating layer.

12. A driving method of a solid-state image pickup element, the solid-state image pickup element including (A) a light receiving/charge accumulating region formed in a semiconductor layer and formed by laminating M (where $M \geq 2$) light receiving/charge accumulating layers, (B) a charge outputting region formed in the semiconductor layer, (C) a depletion layer forming region formed of a part of the semiconductor layer, the part of the semiconductor layer being situated between the light receiving/charge accumulating region and the charge outputting region, and (D) a control electrode region for controlling a state of formation of a depletion layer in the depletion layer forming region, and the solid-state image pickup element further including a light receiving/charge accumulating layer extending section extending from each light receiving/charge accumulating layer to the depletion layer forming region, the control electrode region including one control electrode section, and the charge outputting region including one charge outputting section, the driving method comprising the step of:

sequentially transferring charges accumulated in the light receiving/charge accumulating layers to the charge outputting section via the depletion layer formed in the depletion layer forming region by sequentially applying a control voltage to the control electrode section.

13. The driving method of the solid-state image pickup element according to claim 12, wherein each light receiving/charge accumulating layer is fully depleted before charge accumulation.

14. The driving method of the solid-state image pickup element according to claim 12, wherein the depletion layer forming region has a first conductivity type, the charge outputting region, the light receiving/charge accumulating layers, and the light receiving/charge accumulating layer extending section have a second conductivity type, and the light receiving/charge accumulating layers are interposed between an upper layer and a lower layer having the first conductivity type.

15. The driving method of the solid-state image pickup element according to claim 12, wherein impurity concentration of the depletion layer forming region is lowered with increasing distance from the control electrode region along a direction of a normal to the semiconductor layer.

16. The driving method of the solid-state image pickup element according to claim 12, wherein an absolute value of a control voltage applied to the control electrode section when a charge accumulated in a light receiving/charge accumulating layer is transferred to the charge outputting section is higher for the light receiving/charge accumulating layer situated at a longer distance from the control electrode region along a direction of a normal to the semiconductor layer.

17. The driving method of the solid-state image pickup element according to claim 12, wherein impurity concentration of a part of the depletion layer forming region, the part of the depletion layer forming region being situated between the light receiving/charge accumulating layer extending section and the control electrode region, differs depending on thickness of the part of the depletion layer forming region, the part of the depletion layer forming region being situated between the light receiving/charge accumulating layer extending section and the control electrode region.

18. The driving method of the solid-state image pickup element according to claim 12, wherein when a charge is an electron, at a time of transferring a charge accumulated in a light receiving/charge accumulating layer to the charge outputting section, potential of the charge outputting section with respect to electrons is lower than potential of the depletion layer, and the potential of the depletion layer is lower than potential of the light receiving/charge accumulating layer.

19. A driving method of a solid-state image pickup element, the solid-state image pickup element including (A) a light receiving/charge accumulating region formed in a semiconductor layer and formed by laminating M (where M≧2) light receiving/charge accumulating layers, (B) a charge outputting region formed in the semiconductor layer, (C) a depletion layer forming region formed of a part of the semiconductor layer, the part of the semiconductor layer being situated between the light receiving/charge accumulating region and the charge outputting region, and (D) a control electrode region for controlling a state of formation of a depletion layer in the depletion layer forming region, and the solid-state image pickup element further including a light receiving/charge accumulating layer extending section extending from each light receiving/charge accumulating layer to the depletion layer forming region, thickness of a part of the depletion layer forming region, the part of the depletion layer forming region being situated between the light receiving/charge accumulating layer extending section and the control electrode region, differing according to each light receiving/charge accumulating layer, the control electrode region including M control electrode sections, and the charge outputting region including M charge outputting sections, the driving method comprising the step of:

transferring charges accumulated in the light receiving/charge accumulating layers to the charge outputting sections via the depletion layer formed in the depletion layer forming region by applying a control voltage to the control electrode sections.

20. A driving method of a solid-state image pickup element, the solid-state image pickup element including (A) a light receiving/charge accumulating region formed in a semiconductor layer and formed by laminating M (where M≧2) light receiving/charge accumulating layers, (B) a charge outputting region formed in the semiconductor layer, (C) a depletion layer forming region formed of a part of the semiconductor layer, the part of the semiconductor layer being situated between the light receiving/charge accumulating region and the charge outputting region, and (D) a control electrode region for controlling a state of formation of a depletion layer in the depletion layer forming region, and the solid-state image pickup element further including a light receiving/charge accumulating layer extending section extending from each light receiving/charge accumulating layer to the depletion layer forming region, projected images of respective light receiving/charge accumulating layer extending sections in the depletion layer forming region not overlapping each other, thickness of a part of the depletion layer forming region, the part of the depletion layer forming region being situated between the light receiving/charge accumulating layer extending section and the control electrode region, being identical at each light receiving/charge accumulating layer, the control electrode region including one control electrode section, and the charge outputting region including M charge outputting sections, the driving method comprising the step of:

simultaneously transferring charges accumulated in the light receiving/charge accumulating layers to the charge outputting sections via the depletion layer formed in the depletion layer forming region by applying a control voltage to the control electrode section.

\* \* \* \* \*